(12) United States Patent
Novak et al.

(10) Patent No.: US 6,727,780 B2
(45) Date of Patent: Apr. 27, 2004

(54) ADDING ELECTRICAL RESISTANCE IN SERIES WITH BYPASS CAPACITORS USING ANNULAR RESISTORS

(75) Inventors: Istvan Novak, Maynard, MA (US); Valerie St.Cyr, Lincoln, MA (US); Michael C. Freda, Morgan Hill, CA (US); Merle Tetreault, Tyngsboro, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 68 days.

(21) Appl. No.: 10/001,781

(22) Filed: Oct. 24, 2001

(65) Prior Publication Data

US 2003/0076197 A1 Apr. 24, 2003

(51) Int. Cl.⁷ .................................................. H03H 7/38
(52) U.S. Cl. ........................ 333/136; 333/32; 333/172
(58) Field of Search .......................... 333/136, 32, 172, 333/12, 22 R

(56) References Cited

U.S. PATENT DOCUMENTS

| | | | |
|---|---|---|---|
| 4,720,766 A | * | 1/1988 | Honda ...................... 361/275.3 |
| 5,347,258 A | * | 9/1994 | Howard et al. ............. 338/333 |
| 5,525,955 A | | 6/1996 | Tonogai et al. ............. 338/185 |
| 5,530,288 A | | 6/1996 | Stone .......................... 257/700 |
| 5,603,847 A | * | 2/1997 | Howard et al. ............... 216/17 |
| 5,708,400 A | * | 1/1998 | Morris ......................... 333/12 |
| 5,708,569 A | * | 1/1998 | Howard et al. ............. 361/760 |
| 5,923,077 A | * | 7/1999 | Chase et al. ................ 257/523 |
| 6,104,258 A | | 8/2000 | Novak |
| 6,194,979 B1 | * | 2/2001 | Bloom et al. ............. 333/22 R |
| 6,215,372 B1 | | 4/2001 | Novak |
| 6,215,373 B1 | | 4/2001 | Novak et al. |
| 6,232,042 B1 | * | 5/2001 | Dunn et al. ................. 430/315 |
| 6,525,622 B1 | * | 2/2003 | Novak et al. ................. 333/32 |

\* cited by examiner

*Primary Examiner*—Robert Pascal
*Assistant Examiner*—Dean Takaoka
(74) *Attorney, Agent, or Firm*—Meyertons Hood Kivlin Kowert & Goetzel, P.C.; B. Noël Kivlin

(57) ABSTRACT

A method for achieving a desired value of electrical impedance between conductors of an electrical power distribution structure by electrically coupling multiple bypass capacitors and corresponding electrical resistance elements in series between the conductors. The resistance elements may be annular resistors, and may provide the designer a greater degree of control of the system ESR. The annular resistors may comprise a first terminal, an annular resistor, and a second terminal. The second terminal may be located within the confines of the annular resistor. The annular resistors may be printed onto a conductive plane (e.g. a power plane or a ground plane), or may be a discrete component.

36 Claims, 22 Drawing Sheets

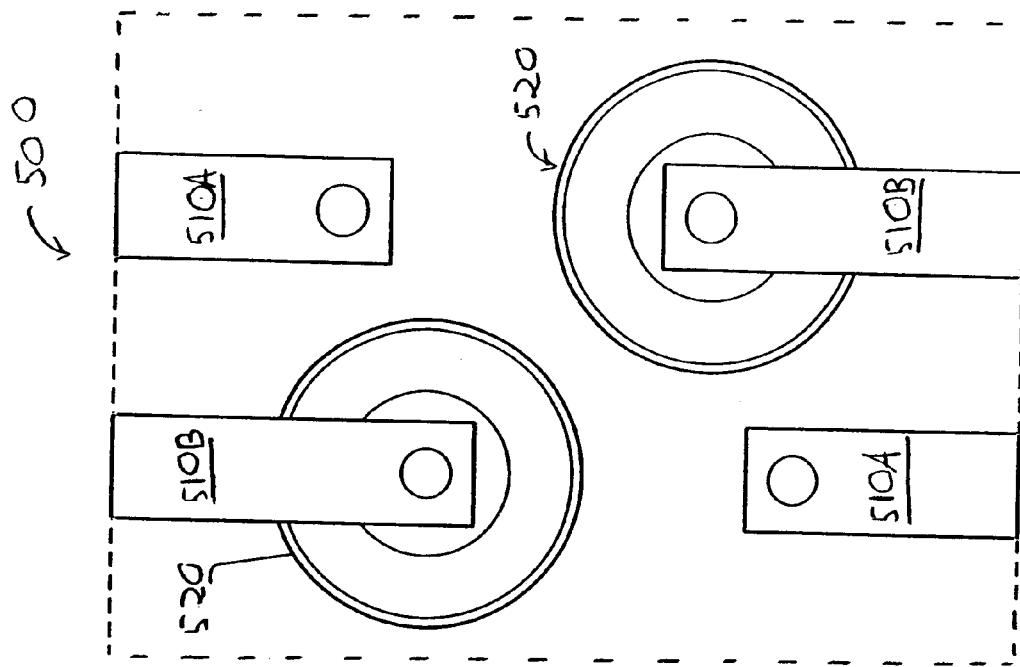
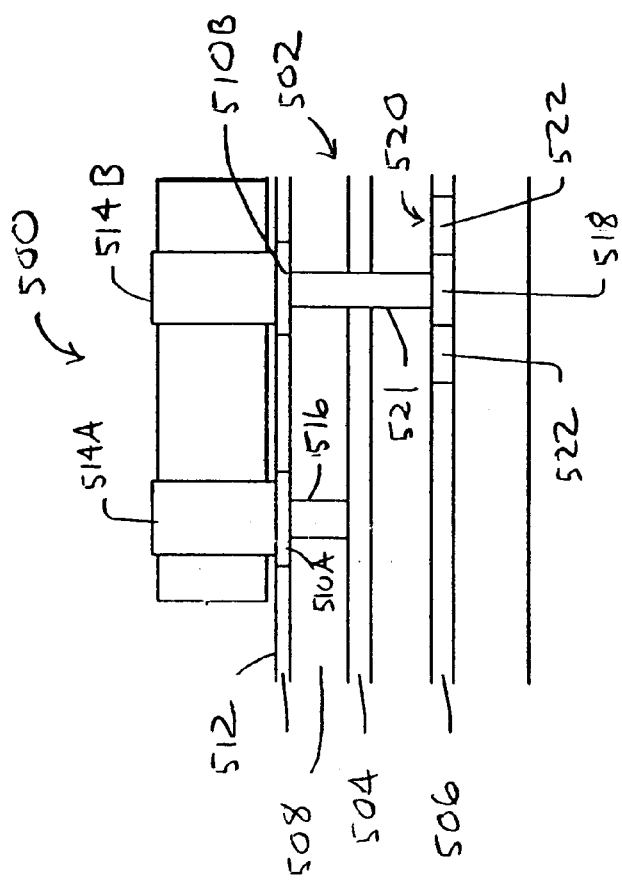
FIG. 18
FIG. 17

ELECTRICALLY COUPLE THE $n_2$ DISCRETE ELECTRICAL CAPACITORS AND THE $n_2$ ELECTRICAL RESISTANCE ELEMENTS BETWEEN THE PLANAR CONDUCTORS ALONG AN OUTER PERIMETER OF THE PARALLEL PLANAR CONDUCTORS SUCH THAT EACH OF THE $n_2$ DISCRETE ELECTRICAL CAPACITORS IS COUPLED IN SERIES WITH A CORRESPONDING ONE OF THE $n_2$ ELECTRICAL RESISTANCE ELEMENTS
358

ELECTRICALLY COUPLE THE $n_1$ DISCRETE ELECTRICAL CAPACITORS AND THE $n_1$ ELECTRICAL RESISTANCE ELEMENTS BETWEEN THE PLANAR CONDUCTORS SUCH THAT: (i) EACH OF THE $n_1$ DISCRETE ELECTRICAL CAPACITORS IS COUPLE IN SERIES WITH A CORRESPONDING ONE OF THE $n_1$ ELECTRICAL RESISTANCE ELEMENTS, (ii) $n_2$ OF THE DISCRETE ELECTRICAL CAPACITORS AND THE CORRESPONDING ELECTRICAL RESISTANCE ELEMENTS ARE POSITIONED ALONG AN OUTER PERIMETER OF THE PLANAR CONDUCTORS, AND (iii) THE REMAINING $(n_1-n_2)$ CAPACITORS AND THE CORRESPONDING ELECTRICAL RESISTANCE ELEMENTS ARE DISPERSED ACROSS A SURFACE OF AT LEAST ONE OF THE PLANAR CONDUCTORS

ADDING ELECTRICAL RESISTANCE IN SERIES WITH BYPASS CAPACITORS USING ANNULAR RESISTORS

BACKGROUND OF THE INVENTION

1. Field of the Invention

This invention relates to electronic systems, and more particularly to electrical interconnecting apparatus forming electrical power distribution structures.

2. Description of the Related Art

A power distribution network of a typical printed circuit board (PCB) includes several capacitors coupled between conductors used to convey direct current (d.c.) electrical power voltages and ground conductors. For example, the power distribution network of a digital PCB typically includes a bulk decoupling or "power entry" capacitor located at a point where electrical power enters the PCB from an external power supply. The power distribution network also typically includes a decoupling capacitor positioned near each of several digital switching circuits (e.g., digital integrated circuits coupled to the PCB). The digital switching circuits dissipate electrical power during switching times (e.g., clock pulse transitions). Each decoupling capacitor typically has a capacitance sufficient to supply electrical current to the corresponding switching circuit during switching times such that the d.c. electrical voltage supplied to the switching circuit remains substantially constant. The power entry capacitor may, for example, have a capacitance greater than or equal to the sum of the capacitances of the decoupling capacitors.

In addition to supplying electrical current to the corresponding switching circuits during switching times, decoupling capacitors also provide low impedance paths to the ground electrical potential for alternating current (a.c.) voltages. Decoupling capacitors thus shunt or "bypass" unwanted a.c. voltages present on d.c. power trace conductors to the ground electrical potential. For this reason, the terms "decoupling capacitor" and "bypass capacitor" are often used synonymously.

As used herein, the term "bypass capacitor" is used to describe any capacitor coupled between a d.c. voltage conductor and a ground conductor, thus providing a low impedance path to the ground electrical potential for a.c. voltages.

A typical bypass capacitor is a two-terminal electrical component. FIG. 1 is a diagram of an electrical model 10 of a capacitor (e.g., a bypass capacitor) valid over a range of frequencies including a resonant frequency $f_{res}$ of the capacitor. Electrical model 10 includes an ideal capacitor, an ideal resistor, and an ideal inductor in series between the two terminals of the capacitor. The ideal capacitor has a value C equal to a capacitance of the capacitor. The ideal resistor has a value equal to an equivalent series resistance (ESR) of the capacitor, and the ideal inductor has a value equal to an equivalent series inductance (ESL) of the capacitor. The series combination of the capacitance (C) and the inductance (ESL) of the capacitor results in series resonance and a resonant frequency $f_{res}$ given by:

$$f_{res} = \frac{1}{2\pi\sqrt{(ESL)(C)}}$$

FIG. 2 is a graph of the logarithm of the magnitude of the electrical impedance (Z) between the terminals of electrical model 10 versus the logarithm of frequency f. At frequencies f lower than resonant frequency $f_{res}$, the impedance of electrical model 10 is dominated by the capacitance, and the magnitude of Z decreases with increasing frequency f. At the resonant frequency $f_{res}$ of the capacitor, the magnitude of Z is a minimum and equal to the ESR of the capacitor. Within a range of frequencies centered about resonant frequency $f_{res}$, the impedance of electrical model 10 is dominated by the resistance, and the magnitude of Z is substantially equal to the ESR of the capacitor. At frequencies f greater than resonant frequency $f_{res}$, the impedance of electrical model 10 is dominated by the inductance, and the magnitude of Z increases with increasing frequency f.

When a desired electrical impedance between a d.c. voltage conductor and a ground conductor is less than the ESR of a single capacitor, it is common to couple more than one of the capacitors in parallel between the d.c. voltage conductor and the ground conductor. In this situation, all of the capacitors have substantially the same resonant frequency $f_{res}$, and the desired electrical impedance is achieved over a range of frequencies including the resonant frequency $f_{res}$.

When the desired electrical impedance is to be achieved over a range of frequencies broader than a single capacitor can provide, it is common to couple multiple capacitors having different resonant frequencies between the d.c. voltage conductor and the ground conductor. The ESRs and resonant frequencies of the capacitors are selected such that each of the capacitors achieves the desired electrical impedance over a different portion of the range of frequencies. In parallel combination, the multiple capacitors achieve the desired electrical impedance over the entire range of frequencies.

A digital signal alternating between high and low voltage levels includes contributions from a fundamental sinusoidal frequency (i.e., a first harmonic) and integer multiples of the first harmonic. As the rise and fall times of a digital signal decrease, the magnitudes of a greater number of the integer multiples of the first harmonic become significant. As a general rule, the frequency content of a digital signal extends to a frequency equal to the reciprocal of $\pi$ times the transition time (i.e., rise or fall time) of the signal. For example, a digital signal with a 1 nanosecond transition time has a frequency content extending up to about 318 MHz.

All conductors have a certain amount of electrical inductance. The voltage across the inductance of a conductor is directly proportional to the rate of change of current through the conductor. At the high frequencies present in conductors carrying digital signals having short transition times, a significant voltage drop occurs across a conductor having even a small inductance. Transient switching currents flowing through electrical impedances of d.c. power conductors cause power supply voltage perturbations (e.g., power supply "droop" and ground "bounce"). As signal frequencies increase, continuous power supply planes (e.g., power planes and ground planes) having relatively low electrical inductances are being used more and more. The parallel power and ground planes are commonly placed in close proximity to one another in order to further reduce the inductances of the planes.

When choosing capacitors for bypassing a power distribution system, a designer may typically specify capacitance of each of the chosen capacitors. However, it may not be possible to specify the resistance and inductance values of the capacitor. Inductance values may depend on the interconnection technology used for the capacitor, and may be influenced somewhat. Resistance values are typically not user definable, and thus, it may be difficult for the designer of the power distribution system to control the ESR.

SUMMARY OF THE INVENTION

Several methods are presented for achieving a desired value of electrical impedance between conductors of an electrical power distribution structure by electrically coupling multiple bypass capacitors and corresponding electrical resistance elements in series between the conductors. The resistance elements may be annular resistors, and may provide the designer a greater degree of control of the system ESR. The annular resistors may comprise a resistive ring having an outer periphery and an inner periphery. The outer periphery may be considered to be a first terminal, while the inner periphery may be considered to be a second terminal. The outer periphery may be electrically coupled to a conductive plane, such as a power plane, while the inner periphery may be coupled to a terminal of a capacitor. The annular resistors may be printed onto a conductive plane (e.g. a power plane or a ground plane), or may be implemented as discrete components, which may be placed into a void of a conductive plane.

The methods include bypass capacitor selection criteria and electrical resistance determination criteria based upon simulation results. An exemplary electrical power distribution structure produced by one of the methods includes at least one pair of parallel planar conductors separated by a dielectric layer, n discrete electrical capacitors, and n electrical resistance elements, where $n \geq 2$. Each of the n discrete electrical resistance elements is coupled in series with a corresponding one of the n discrete electrical capacitors between the planar conductors. The n capacitors have substantially the same capacitance C, mounted resistance $R_m$, mounted inductance $L_m$, and mounted resonant frequency $f_{m-res}$. The mounted resistance $R_m$ of each of the n capacitors includes an electrical resistance of the corresponding electrical resistance element. The electrical power distribution structure achieves an electrical impedance Z at the resonant frequency $f_{m-res}$ of the capacitors. In order to achieve the desired value of electrical impedance, the mounted resistance $R_m$ of each of the n capacitors is substantially equal to (n·Z). In order to reduce variations in the electrical impedance with frequency, the mounted inductance $L_m$ of each of the n capacitors is less than or equal to $(0.2 \cdot n \cdot \mu_0 \cdot h)$, where $\mu_0$ is the permeability of free space, and h is a distance between the planar conductors. It is noted that dielectric materials used to form dielectric layers are typically non-magnetic, and thus the relative permeability $\mu_r$ of the dielectric layer is assumed to be unity.

The mounted resistance $R_m$ of each of the n capacitors may be, for example, the sum of an equivalent series resistance (ESR) of the capacitor, the electrical resistance of the corresponding electrical resistance element, and the electrical resistances of all conductors coupling the capacitor between the planar conductors. The mounted inductance $L_m$ of each of the n capacitors may be the electrical inductance resulting from the coupling of the capacitor between the planar conductors. For example, each of the n capacitors may have a body. In this situation, the mounted resistance $R_m$ of each of the n capacitors may be the sum of the ESR of the capacitor body, the electrical resistance of the corresponding electrical resistance element, and the electrical resistances of all conductors (e.g., solder lands and vias) coupling the capacitor body between the planar conductors. Similarly, the mounted inductance $L_m$ of each of the n capacitors may be the electrical inductance resulting from the coupling of the capacitor body between the planar conductors. The mounted resonant frequency $f_{m-res}$ resulting from capacitance C and mounted inductance $L_m$ may be given by:

$$f_{m-res} = \frac{1}{2\pi\sqrt{(L_m)(C)}}$$

The n discrete capacitors may or may not be used to suppress electrical resonances between the planar conductors. Where the n discrete capacitors are not used to suppress the electrical resonances, the n discrete capacitors may be located upon, and distributed about, one or more surfaces of the planar conductors. On the other hand, when the n discrete capacitors are used to suppress the electrical resonances, the n discrete capacitors may be positioned along at least a portion of corresponding outer edges of the planar conductors. In this situation, adjacent capacitors may be separated by substantially equal spacing distances.

Several embodiments of an electrical power distribution structure are presented including an electrical resistance element coupled in series with a capacitor between a pair of parallel conductive planes separated by a dielectric layer (e.g., between a power plane and a ground plane). In the embodiments, the electrical resistance elements are incorporated in ways which do not appreciably increase physical dimensions of current loops coupling the capacitor between the pair of parallel conductive planes. As a result, the mounted inductance $L_m$ of the capacitor is not changed substantially over a corresponding conventional structure.

A first method for achieving a target electrical impedance $Z_t$ in an electrical power distribution structure including a pair of parallel planar conductors separated by a dielectric layer may be useful where bypass capacitors will not be used to suppress plane resonances. In this situation, the bypass capacitors may be distributed about a surface of at least one of the planar conductors. The first method includes determining a required number n of a selected type of discrete electrical capacitor dependent upon an inductance of the electrical power distribution structure $L_p$ and a mounted inductance $L_m$ of a representative one of the selected type of discrete electrical capacitor when electrically coupled between the planar conductors, wherein $n \geq 2$. The required number n of the selected type of capacitor may be determined using:

$$n = \frac{L_m}{(0.2 \cdot L_p)}$$

The target electrical impedance $Z_t$ is used to determine a required value of mounted resistance $R_{m-req}$ for the n discrete electrical capacitors. The required value of mounted resistance $R_{m-req}$ may be determined using:

$$R_{m-req} = n \cdot Z_t$$

The required number n of the selected type of discrete electrical capacitor may be selected such that each of the n capacitors has an equivalent series resistance (ESR) which is less than the required value of mounted resistance $R_{m-req}$. The mounted resistance $R_m$ of a representative one of the n capacitors may be determined when the representative capacitor is coupled between the pair of parallel planar conductors and when the electrical resistance of a corresponding electrical resistance element is zero. The electrical resistance of each of n electrical resistance elements may be determined by subtracting the mounted resistance $R_m$ of the representative capacitor from the required value of mounted resistance $R_{m\text{-}req}$. The n discrete electrical capacitors and the n electrical resistance elements may be electrically coupled between the planar conductors such that each of the n discrete electrical capacitors is coupled in series with a corresponding one of the n electrical resistance elements.

The first method may also include determining a separation distance h between the parallel planar conductors required to achieve the target electrical impedance $Z_t$. The separation distance h may be determined using:

$$h = \frac{(Z_t)(\sqrt{\varepsilon_r})(d_p)}{(0.523)}$$

where $\varepsilon_r$ is the relative permittivity of the dielectric layer and $d_p$ is a distance around an outer perimeter of the electrical power distribution structure. Separation distance h is in milli-inches (hereinafter "mils") when the target electrical impedance $Z_t$ is in ohms and distance $d_p$ is in inches.

A thickness t for the dielectric layer may be selected such that the thickness t is less than or equal to the required separation distance h. Thickness t may be used to determine the inductance of the electrical power distribution structure $L_p$. The inductance of the electrical power distribution structure $L_p$ may be determined using:

$$L_p = (\mu_0 \cdot t)$$

wherein $\mu_0$ is the permeability of free space.

The type of discrete electrical capacitor may be selected, wherein capacitors of the selected type have at least one substantially identical physical dimension (e.g., a length of the capacitor package between terminals) upon which the mounted inductance of the capacitors is dependent. The physical dimension may be used to determine the mounted inductance $L_m$ of the representative capacitor.

A second method for achieving a target electrical impedance $Z_t$ in an electrical power distribution structure including a pair of parallel planar conductors separated by a dielectric layer may be useful where the bypass capacitors will be used to suppress plane resonances. In this situation, at least a portion of the bypass capacitors will be electrically coupled between the planar conductors along an outer edge of the planar conductors. The second method includes determining a first required number $n_1$ of discrete electrical capacitors dependent upon an inductance of the electrical power distribution structure $L_p$ and a mounted inductance $L_m$ of each of the discrete electrical capacitors when electrically coupled between the planar conductors, where $n_1 \geq 2$. The first required number $n_1$ of the discrete electrical capacitors may be determined using:

$$n_1 = \frac{L_m}{(0.2 \cdot L_p)}$$

A second required number $n_2$ of the discrete electrical capacitors is determined dependent upon a distance $d_p$ around an outer perimeter of the electrical power distribution structure (i.e., the parallel planar conductors) and a spacing distance S between adjacent discrete electrical capacitors, where $n_2 \geq 2$. The second required number $n_2$ of the discrete electrical capacitors may be determined using:

$$n_2 = \frac{d_p}{S}$$

Spacing distance S may be less than or equal to a maximum spacing distance $S_{max}$ between adjacent electrical capacitors. The electrical power distribution structure may be, for example, part of an electrical interconnecting apparatus, and electrical signals may be conveyed within the electrical interconnecting apparatus. The electrical signals may have an associated frequency range, and maximum spacing distance $S_{max}$ may be a fraction of a wavelength of a maximum frequency $f_{max}$ of the frequency range of the electrical signals. Maximum spacing distance $S_{max}$ may be given by:

$$S_{max} = 0.1 \cdot \frac{c}{(\sqrt{\varepsilon_r} \cdot f_{max})}$$

wherein c is the speed of light in a vacuum, $\varepsilon_r$ is the relative permittivity (i.e., the dielectric constant) of the dielectric layer, and $f_{max}$ is the maximum frequency of the frequency range of the electrical signals.

If $n_2 \geq n_1$, the following steps may be performed. A required value of mounted resistance $R_{m\text{-}req}$ may be determined for $n_2$ of the discrete electrical capacitors dependent upon the target electrical impedance $Z_t$. The required value of mounted resistance $R_{m\text{-}req}$ for the $n_2$ capacitors may be determined using:

$$R_{m\text{-}req} = n_2 \cdot Z_t$$

The number $n_2$ of the discrete electrical capacitors may be selected wherein each of the $n_2$ capacitors has an equivalent series resistance (ESR) which is less than the required value of mounted resistance $R_{m\text{-}req}$. The mounted resistance $R_m$ of a representative one of the $n_2$ capacitors may be determined when the representative capacitor is coupled between the pair of parallel planar conductors and when the electrical resistance of a corresponding electrical resistance element is zero. The electrical resistance of each of $n_2$ electrical resistance elements may be determined by subtracting the mounted resistance $R_m$ of the representative capacitor from the required value of mounted resistance $R_{m\text{-}req}$. The $n_2$ discrete electrical capacitors and the $n_2$ electrical resistance elements may be electrically coupled between the planar conductors along the outer perimeter of the parallel planar conductors such that each of the $n_2$ discrete electrical capacitors is coupled in series with a corresponding one of the $n_2$ electrical resistance elements.

The second method may also include the determining of a separation distance h between the parallel planar conductors required to achieve the target electrical impedance $Z_t$ as described above. A thickness t for the dielectric layer may be selected such that the thickness t is less than or equal to the required separation distance h. Thickness t may be used to determine the inductance of the electrical power distribution structure $L_p$ as described above.

The type of discrete electrical capacitor may be selected, wherein capacitors of the selected type have at least one substantially identical physical dimension (e.g., a length of the capacitor package between terminals) upon which the mounted inductance of the capacitors is dependent. The physical dimension may be used to determine the mounted inductance $L_m$ of the representative capacitor.

If $n_1 > n_2$, the following steps may be performed. The target electrical impedance $Z_t$ may be used to determine a required value of mounted resistance $R_{m\text{-}req}$ for $n_1$ of the discrete electrical capacitors. The required value of mounted resistance $R_{m\text{-}req}$ for the $n_1$ capacitors may be determined using:

$$R_{m\text{-}req} = n_1 \cdot Z_t$$

The number $n_1$ of the discrete electrical capacitors may be selected, wherein each of the $n_1$ capacitors has an equivalent series resistance (ESR) which is less than the required value of mounted resistance $R_{m\text{-}req}$. The mounted resistance $R_m$ of a representative one of the $n_1$ capacitors may be determined when the representative capacitor is coupled between the pair of parallel planar conductors and when the electrical resistance of a corresponding electrical resistance element is zero. The electrical resistance of each of $n_1$ electrical resistance elements may be determined by subtracting the mounted resistance $R_m$ of the representative capacitor from the required value of mounted resistance $R_{m\text{-}req}$. The $n_1$ discrete electrical capacitors and the $n_1$ electrical resistance elements may be electrically coupled between the planar conductors such that: (i) each of the $n_1$ discrete electrical capacitors is coupled in series with a corresponding one of the $n_1$ electrical resistance elements, (ii) $n_2$ of the discrete electrical capacitors and the corresponding electrical resistance elements are positioned along an outer perimeter of the planar conductors, and (iii) the remaining $(n_1-n_2)$ capacitors and the corresponding electrical resistance elements are dispersed across a surface of at least one of the planar conductors.

Regarding distance $d_p$ around the outer edges (i.e., the outer perimeter) of the electrical power distribution structure, the electrical power distribution structure may have, for example, four sides arranged as two pairs of opposite sides. The sides forming one of the pairs of opposite sides may have equal lengths x, and the other two opposite sides may have equal lengths y. In this situation, the distance $d_p$ around the outer perimeter of the electrical power distribution structure is equal to $2 \cdot (x+y)$.

BRIEF DESCRIPTION OF THE DRAWINGS

Other aspects of the invention will become apparent upon reading the following detailed description and upon reference to the accompanying drawings in which:

FIG. 17 is a side view of a second embodiment of a four-terminal capacitor mounted on a printed circuit board, wherein some of the capacitor terminals are electrically connected to a ground plane, and some of the terminals are electrically connected to annular resistors which are printed into a power plane;

FIG. 18 is a top plan view of the second embodiment of a four-terminal capacitor, wherein two of the capacitor terminals are connected to annular resistors;

Figure 1:
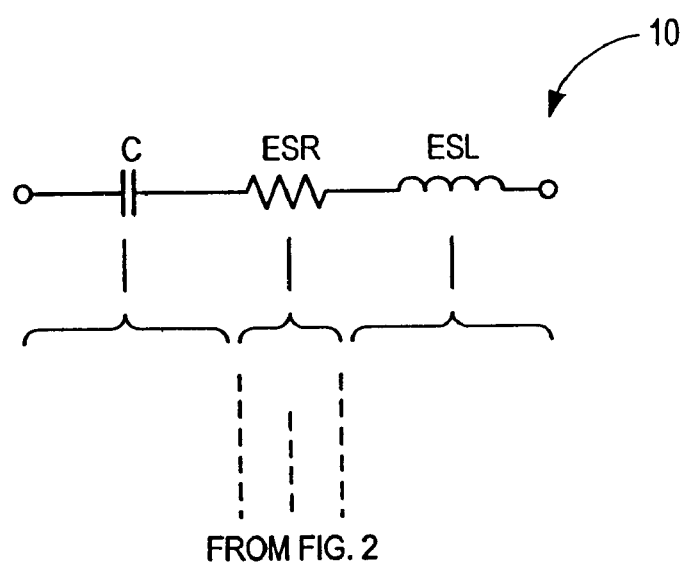
FIG. 1 is a diagram of an electrical model of a capacitor (e.g., a bypass capacitor) valid over a range of frequencies including a resonant frequency $f_{res}$ of the capacitor, wherein the electrical model includes an ideal capacitor, an ideal resistor, and an ideal inductor in series between two terminals of the capacitor, and wherein the ideal capacitor has a value C equal to a capacitance of the capacitor, and wherein the ideal resistor has a value equal to an equivalent series resistance (ESR) of the capacitor, and wherein the ideal inductor has a value equal to an equivalent series inductance (ESL) of the capacitor.
Figure 2:
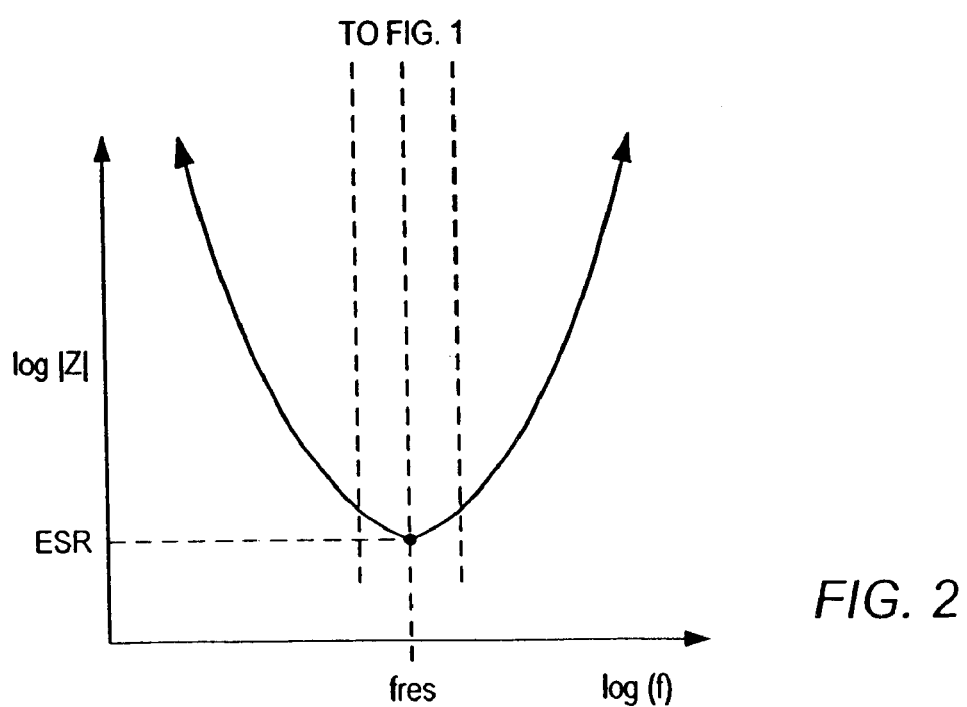
FIG. 2 is a graph of the logarithm of the magnitude of the electrical impedance (Z) between the terminals of the electrical model of FIG. 1 versus the logarithm of frequency f.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Figure 3:
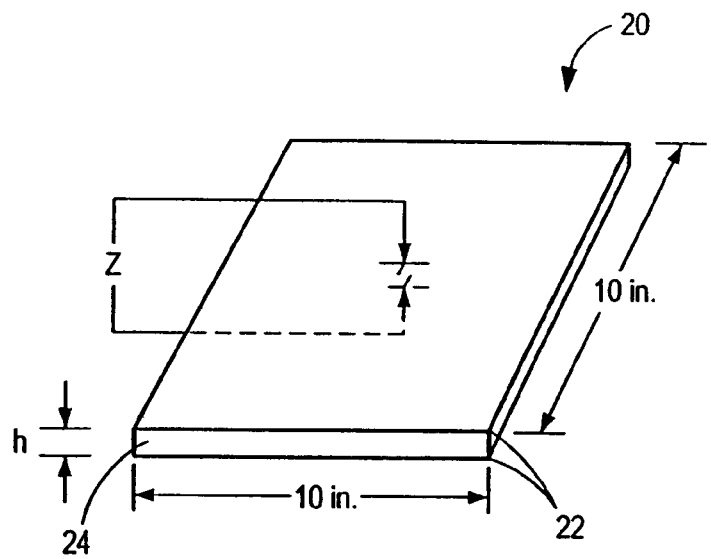
FIG. 3 is a perspective view of a structure including a pair of 10 in.×10 in. square conductive planes separated by a dielectric layer having a dimension or height h between the conductive planes.

FIG. 3 is a perspective view of a structure 20 including a pair of 10 in.×10 in. square conductive planes 22 separated by a fiberglass-epoxy composite dielectric layer 24 having a height h. Each conductive plane 22 is made of copper and is about 0.0014 in. thick. Dielectric layer 24 is made of FR4 dielectric material having a dielectric constant of about 4.0, and height h is approximately 0.002 in.

Figure 4:
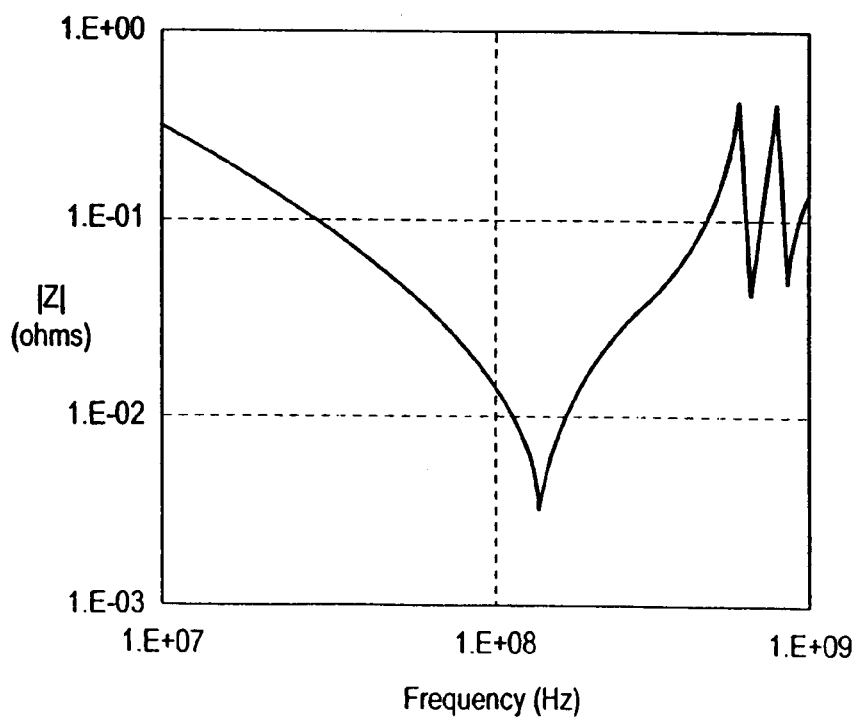
FIG. 4 is a graph of the simulated magnitude of electrical impedance (Z) of the structure of FIG. 3 between the pair of rectangular conductive planes versus frequency.

FIG. 4 is a graph of the simulated magnitude of electrical impedance (Z) of structure 20 of FIG. 3 between the pair of rectangular conductive planes 22 versus frequency. The graph was created by modeling each half-inch square of the pair of conductive planes 22 as a matrix of transmission lines. The impedance value was computed by simulating the application of a 1 ampere constant current between the centers of planes 22, varying the frequency of the current, and determining the magnitude of the steady state voltage between the centers of planes 22.

As shown in FIG. 4, the magnitude of the electrical impedance between conductive planes 22 of FIG. 3 varies widely at frequencies above about 500 MHz. Conductive planes 22 exhibit multiple electrical resonances at frequencies between about 150 MHz and 1 GHz, resulting in alternating high and low impedance values. Conductive planes 22 would be poor candidates for power and ground planes of an electrical interconnecting apparatus (e.g., a PCB) conveying signals having significant frequency content above 500 MHz as the high impedance values of conductive planes 22 at frequencies above 500 MHz would cause relatively large power supply voltage perturbations.

Figure 5:
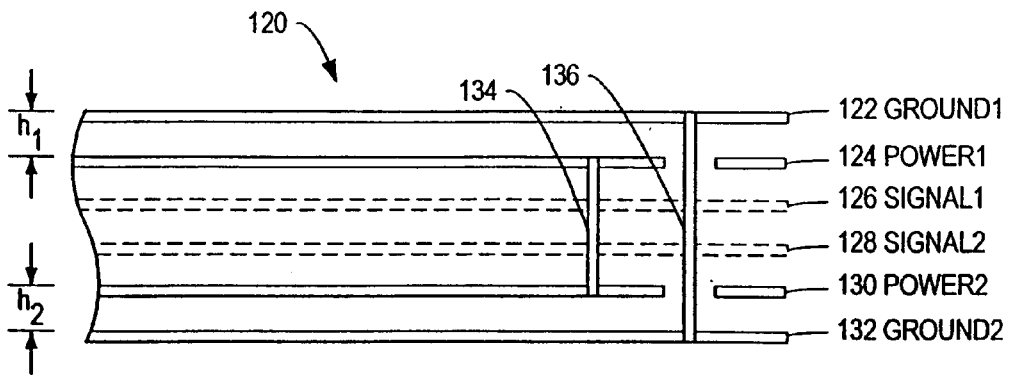
FIG. 5 is a cross sectional view of a portion of one embodiment of an electrical interconnecting apparatus including a power distribution structure having two different pairs of conductive power planes, wherein the interconnecting apparatus includes two signal planes between the pairs of power planes.
Figure 6:
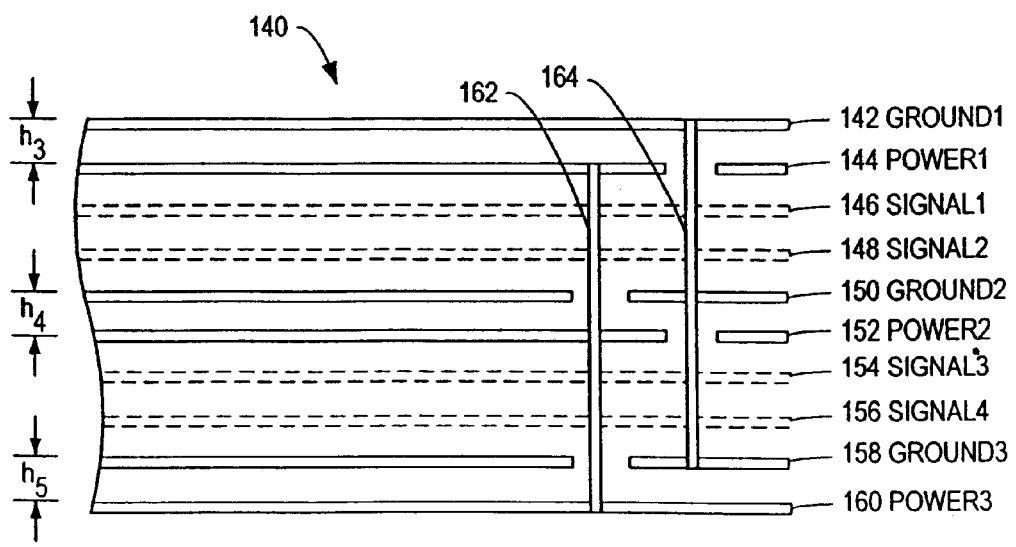
FIG. 6 is a cross sectional view of a portion of one embodiment of an electrical interconnecting apparatus including a power distribution structure having three different pairs of conductive power planes, wherein the interconnecting apparatus includes two signal planes between a first and a second of the three pairs of power planes, and two more signal planes between the second and the third of the three pairs of power planes.

FIGS. 5 and 6 will now be used to illustrate exemplary interconnect apparatus and how an effective distance (e.g., height) h may be calculated for power distribution structures of the interconnect apparatus. FIG. 5 is a cross sectional view of a portion of one embodiment of an electrical interconnecting apparatus 120 including a power distribution structure having two different pairs of conductive power planes. Interconnecting apparatus 120 includes a GROUND1 plane 122 and a POWER1 plane 124 forming one of the pairs of conductive power planes, a SIGNAL1 plane 126, a SIGNAL2 plane 128, and a POWER2 plane 130 and a GROUND2 plane 132 forming the other pair of conductive power planes. POWER1 plane 124 and POWER2 plane 130 are coupled by a via 134, and GROUND1 plane 122 and GROUND2 plane 132 are coupled by a via 136. SIGNAL1 plane 126 and SIGNAL2 plane 128 are used to convey electrical signals within interconnecting apparatus 120.

As shown in FIG. 5, GROUND1 plane 122 and POWER1 plane 124 are separated by a height $h_1$, and POWER2 plane 130 and GROUND2 plane 132 are separated by a height $h_2$. For interconnecting apparatus 120 of FIG. 5, h for use in the above equation for calculating the impedance of the power distribution structure is given by:

$$h = \frac{1}{\frac{1}{h_1} + \frac{1}{h_2}}$$

where $h_1$ and $h_2$ are in mils. It is noted that if $h_1=h_2=h_x$, then $h=h_x/2$.

FIG. 6 is a cross sectional view of a portion of one embodiment of an electrical interconnecting apparatus 140 including a power distribution structure having three different pairs of conductive power planes. Interconnecting apparatus 140 includes a GROUND1 plane 142 and a POWER1 plane 144 forming a first of the three pairs of conductive power planes, a SIGNAL1 plane 146, a SIGNAL2 plane 148, a GROUND2 plane 150 and a POWER2 plane 152 forming a second of three pairs of conductive power planes, a SIGNAL3 plane 154, a SIGNAL4 plane 156, and a GROUND3 plane 158 and a POWER3 plane 160 forming the third pair of conductive power planes. POWER1 plane 144, POWER2 plane 152, and POWER3 plane 160 are coupled by a via 162, and GROUND1 plane 142, GROUND2 plane 150, and GROUND3 plane 158 are coupled by a via 164. SIGNAL1 plane 146, SIGNAL2 plane 148, SIGNAL3 plane 154, and SIGNAL4 plane 156 are used to convey electrical signals within interconnecting apparatus 140.

As shown in FIG. 6, GROUND1 plane 142 and POWER1 plane 144 are separated by a height $h_3$, POWER2 plane 152 and GROUND2 plane 150 are separated by a height $h_4$, and POWER3 plane 160 and GROUND3 plane 158 are separated by a height $h_5$. For interconnecting apparatus 140 of FIG. 6, h for use in the above equation for calculating the impedance of the power distribution structure is given by:

$$h = \frac{1}{\frac{1}{h_3}+\frac{1}{h_4}+\frac{1}{h_5}}$$

where $h_3$, $h_4$, and $h_5$ are in mils. It is noted that if $h_3=h_4=h_5=h_y$, then $h=h_y/3$.

The smoothest impedance curve for a pair of parallel conductive planes separated by a dielectric layer may be achieved when the parallel resultant of the ESR values of all n bypass capacitors (ESR/n) coupled between the pair of parallel conductive planes is equal to the characteristic impedance of the pair of parallel conductive planes. As described above, a separation distance h between the parallel conductive planes may be determined in order to achieve a target electrical impedance $Z_t$. The target electrical impedance $Z_t$ may then be used to determine a required value of mounted resistance $R_{m-req}$ for n discrete electrical capacitors (e.g., bypass capacitors):

$$R_{m-req}=n \cdot Z_t$$

The n discrete electrical capacitors may be selected such that the n capacitors each have an equivalent series resistance (ESR) which is less than or equal to the required value of mounted resistance $R_{m-req}$. Where the ESR of the n capacitors is less than the required value of mounted resistance $R_{m-req}$, an electrical resistance element may be placed in series with each of the n capacitors. In this situation, the mounted resistance $R_m$ of a given one of the n capacitors may include the ESR of the capacitor, an electrical resistance of a corresponding electrical resistance element in series with the capacitor, and the electrical resistances of all conductors coupling the capacitor between the pair of parallel conductive planes.

The electrical resistance value for each of the n electrical resistance elements may be selected such that the mounted resistance $R_m$ of each of the n capacitors is equal to the required value of mounted resistance $R_{m-req}$. This may be accomplished by determining the mounted resistance $R_m$ of a representative one of the n capacitors when coupled between the planar conductors and when the electrical resistance of the corresponding electrical resistance element is zero. In this situation, the mounted resistance $R_m$ of the representative capacitor may be equal to the sum of the ESR of the representative capacitor and the electrical resistances of all conductors coupling the capacitor between the planar conductors. The electrical resistance of each of the n electrical resistance elements may be determined by subtracting the mounted resistance $R_m$ of the representative capacitor from the required value of mounted resistance $R_{m-req}$.

FIGS. 7–13 will now be used to illustrate several embodiments of an electrical power distribution structure including an electrical resistance element coupled in series with a capacitor between a pair of parallel conductive planes separated by a dielectric layer (e.g., between a power plane and a ground plane). In the embodiments of FIGS. 7–13, electrical resistance elements are incorporated in ways which do not appreciably increase physical dimensions of current loops coupling the capacitor between the pair of parallel conductive planes. As a result, the mounted inductance $L_m$ of the capacitor is not changed substantially over a corresponding conventional structure.

Figure 7:
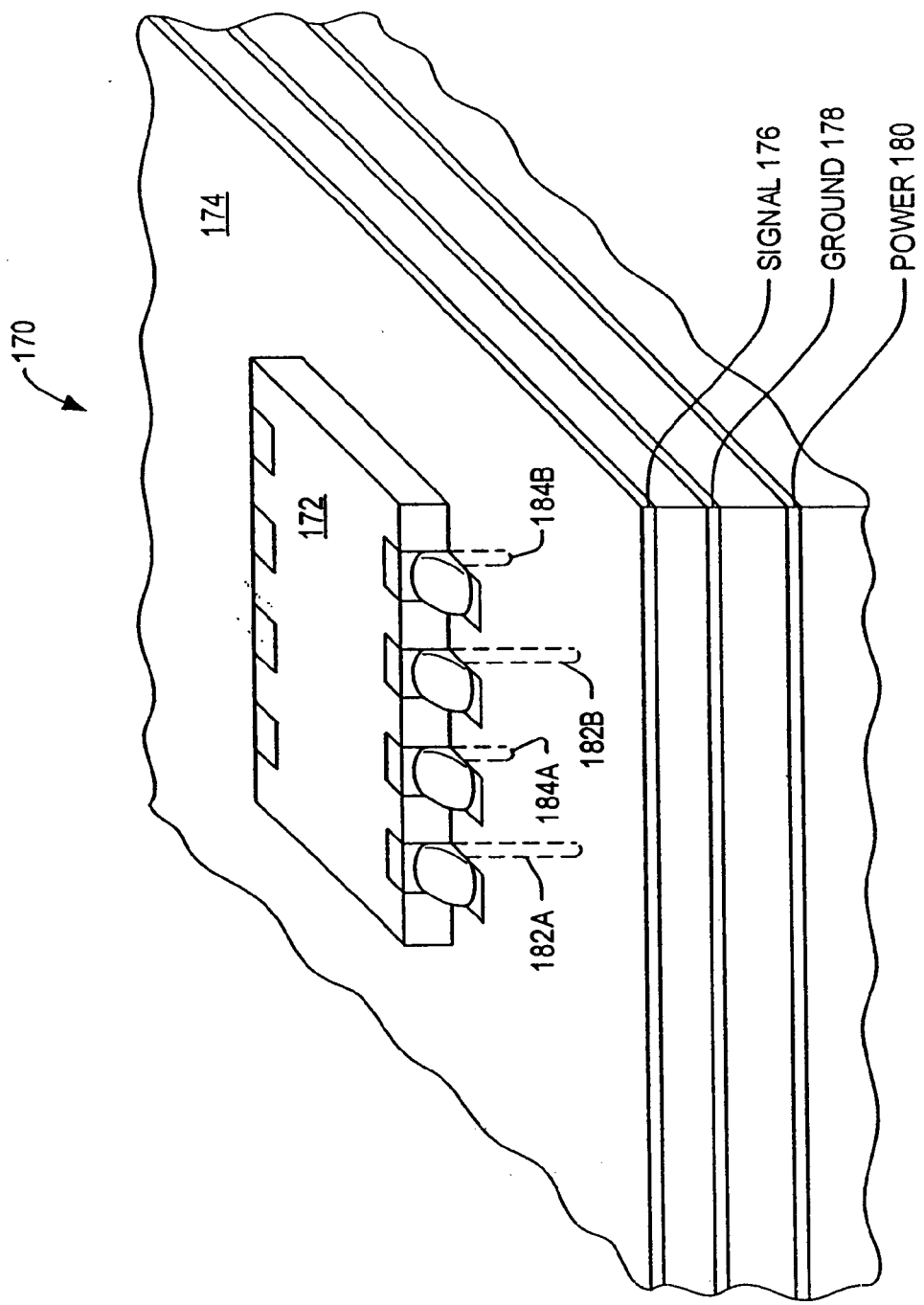
FIG. 7 is a perspective view of a portion of an electrical power distribution structure including a capacitor (e.g., an interdigitated capacitor) mounted upon an upper surface of an interconnecting apparatus and electrically coupled between an electrical power (i.e., power) conductor layer and an electrical ground (i.e., ground) conductor layer of the interconnecting apparatus.

FIG. 7 is a perspective view of a portion 170 of an electrical power distribution structure including a capacitor 172 (e.g., an interdigitated capacitor) mounted upon an upper surface of an interconnecting apparatus 174. Interconnecting apparatus 174 may be, for example, a PCB, a component of a semiconductor device package, or formed upon a surface of an integrated circuit substrate.

Interconnecting apparatus 174 includes a signal conductor layer 176, an electrical ground (i.e., ground) conductor layer 178, and an electrical power (i.e., power) conductor layer 180. Capacitor 172 has a body and multiple power and ground terminals positioned along opposite side surfaces of the body. The power and ground terminals alternate along the sides of the body. A total of 8 vias are used to couple capacitor 172 between power conductor layer 180 and ground conductor layer 178. Vias 182A and 182B of FIG. 7 are used to connect corresponding power terminals of capacitor 172 to a portion of power conductor layer 180. Vias 184A and 184B of FIG. 7 are used to connect corresponding ground terminals of capacitor 172 to ground conductor layer 178. Two other vias on a side of capacitor 172 opposite vias 182A, 182B, 184A, and 184B are used to couple corresponding power terminals of capacitor 172 to power conductor layer 180. An additional two vias on the opposite side of capacitor 172 are used to connect corresponding ground terminals of capacitor 172 to ground conductor layer 178. The multiple parallel current paths formed between power conductor layer 180 and ground conductor layer 178 through capacitor 172 reduce a mounted inductance of capacitor 172.

Figure 8:
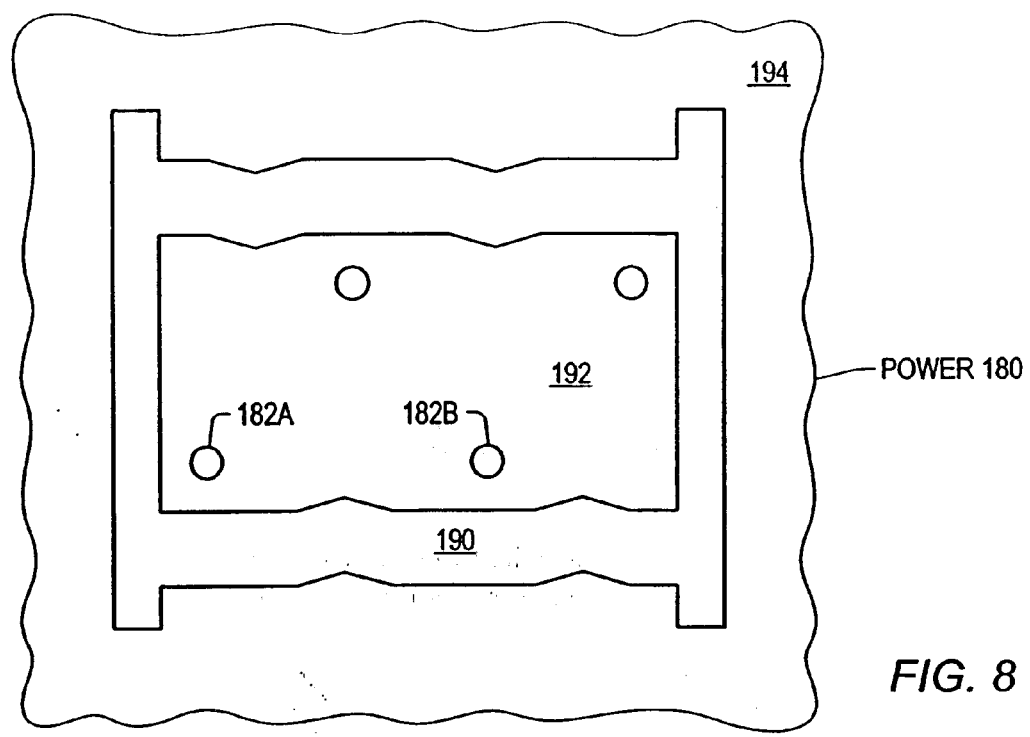
FIG. 8 is a top plan view of one embodiment of the power conductor layer of FIG. 7 following a process (e.g., an etch process) during which a portion of an electrically conductive material (e.g., a metal) forming the power conductor layer is removed from an isolation region, thereby forming an island electrically isolated from a remainder of the power conductor layer.

FIG. 8 is a top plan view of one embodiment of power conductor layer 180 of FIG. 7 following a process (e.g., an etch process) during which a portion of an electrically conductive material (e.g., a metal) forming power conductor layer 180 is removed from an isolation region 190, thereby forming an island 192 electrically isolated from a remainder 194 of power conductor layer 180.

Figure 9:
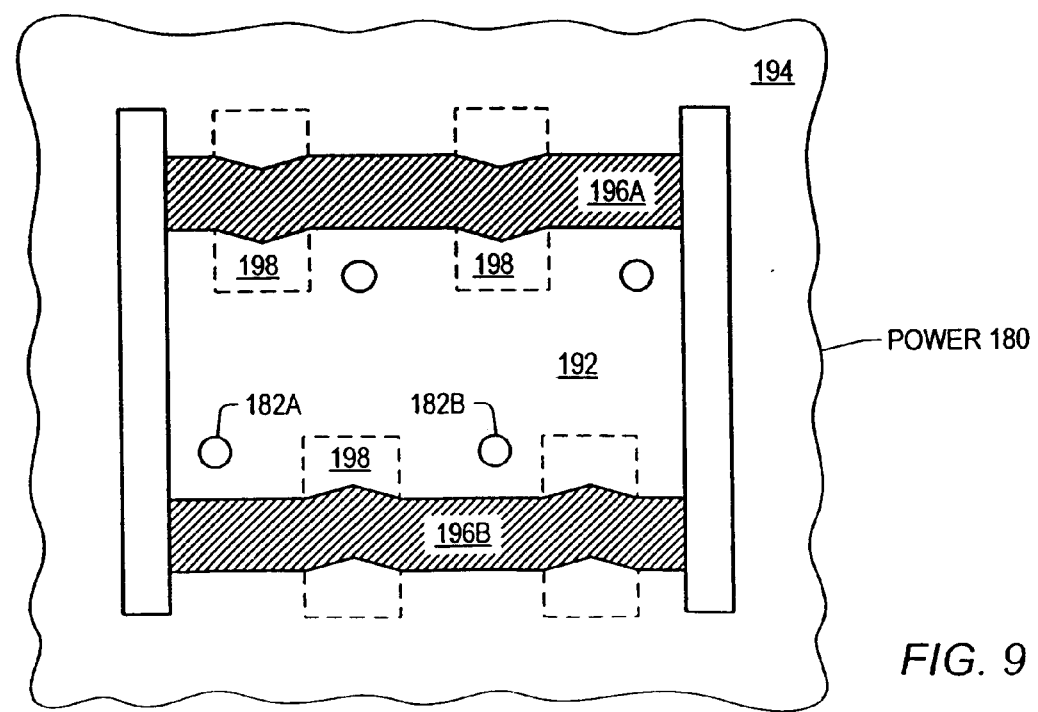
FIG. 9 is a top plan view of the embodiment of the power conductor layer of FIG. 7 following a process during which two resistive stripes are formed between the island and the remainder of the power conductor layer on opposite sides of the island, wherein the capacitor of FIG. 7 and an electrical resistance offered by the two resistive stripes of FIG. 9 are coupled in series between the power conductor layer and the ground conductor layer of the interconnecting apparatus of FIG. 7.

FIG. 9 is a top plan view of the embodiment of power conductor layer 180 of FIG. 8 following a process during which two resistive stripes 196A and 196B are formed between island 192 and remainder 194 of power conductor layer 180. In the embodiment of FIG. 9, resistive stripes 196A and 196B are formed in portions of isolation region 190 on opposite sides of island 192.

During use of interconnecting apparatus 174 (FIG. 7), an electrical power supply voltage is impressed between remainder 194 of power conductor layer 180 and ground conductor layer 178. Connected between island 192 and ground conductor layer 178 by the eight vias, capacitor 172 presents an electrical capacitance between island 192 and ground conductor layer 178. Resistive stripes 196A and 196B resistively couple island 192 to remainder 194 of power conductor layer 180. Resistive stripes 196A and 196B, electrically in parallel between island 192 and remainder 194 of power conductor layer 180, present a single value of resistance between island 192 and remainder 194 of power conductor layer 180. The electrical resistance presented by resistive stripes 196A and 196B and the electrical capacitance of capacitor 172 are coupled in series between remainder 194 of power conductor layer 180 and ground conductor layer 178, forming a series resistance-capacitance (RC) network between remainder 194 of power conductor layer 180 and ground conductor layer 178.

Resistive stripes 196A and 196B are formed from electrically resistive materials (e.g., resistive inks). Resistive stripes 196A and 196B each present an electrical resistance between island 192 and remainder 194 of power conductor layer 180. The magnitudes of the resistances presented by resistive stripes 196A and 196B depend upon the physical dimensions of respective resistive stripes 196A and 196B. The magnitudes of the resistances presented by resistive stripes 196A and 196B are also dependent upon the electrical resistivities of the electrically resistive materials used to form respective resistive stripes 196A and 196B.

In the embodiment of FIG. 9, multiple anchor regions 198 exist in power conductor layer 180 along perimeters of remainder 194 and island 192 adjacent to the portions of isolation region 190 where resistive stripes 196A and 196B are formed. Each anchor region includes a protrusion extending outwardly from a perimeter of remainder 194 toward island 192 and a correspondingly-shaped recess in an adjacent perimeter of island 192. Anchor regions 198 help keep resistive stripes 196A and 196B in place despite any lateral shear forces which may be exerted upon resistive stripes 196A and 196B during assembly of interconnecting apparatus 174.

In the embodiment of FIG. 9, resistive stripes 196A and 196B are formed from a material having an electrical resistivity higher than that of the electrically conductive material (e.g., a metal) removed from power conductor layer 180 to form isolation region 190. As a result, a mounted resistance $R_m$ of capacitor 172 is increased over a corresponding conventional structure. A mounted inductance $L_m$ of capacitor 172 would not be expected to change substantially over the corresponding conventional structure as the physical dimensions of the current path through capacitor 172 are substantially unchanged over the corresponding conventional structure.

Capacitor 172 may be, for example, one of n capacitors coupled between power conductor layer 180 and ground conductor layer 178 to stabilize the electrical impedance of the electrical distribution structure including power conductor layer 180 and ground conductor layer 178. A target electrical impedance $Z_t$ may be used to determine a required value of mounted resistance $R_{m-req}$ for the n capacitors according to:

$$R_{m-req} = n \cdot Z_t$$

Capacitor 172 may have an ESR which is less than the required value of mounted resistance $R_{m-req}$. In this situation, the electrical resistance value offered by resistive stripes 196A and 196B in parallel may be selected such that the mounted resistance $R_m$ of capacitor 172 is equal to the required value of mounted resistance $R_{m-req}$. This may be accomplished by determining the mounted resistance $R_m$ of capacitor 172 when the electrical resistance value offered by resistive stripes 196A and 196B in parallel is zero. The mounted resistance $R_m$ of capacitor 172 when the electrical resistance value offered by resistive stripes 196A and 196B in parallel is zero may be equal to the sum of the ESR of capacitor 172 and the electrical resistances of all conductors coupling capacitor 172 between the planar conductors. The electrical resistance value offered by resistive stripes 196A and 196B in parallel may be determined by subtracting the mounted resistance $R_m$ of capacitor 172 when the electrical resistance value offered by resistive stripes 196A and 196B in parallel is zero from the required value of mounted resistance $R_{m-req}$.

Figure 10:
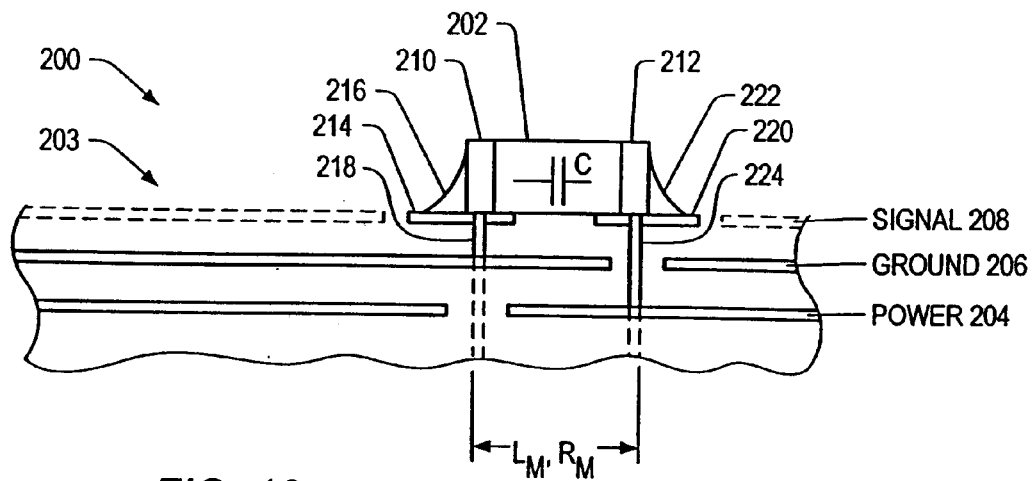
FIG. 10 is a cross sectional view of a portion of an electrical power distribution structure wherein vias with relatively high electrical resistances are used to electrically couple a capacitor (e.g., a multilayer ceramic capacitor) between a planar power conductor (i.e., a power plane) and a planar ground conductor (i.e., a ground plane) of an interconnecting apparatus.

FIG. 10 is a cross sectional view of a portion 200 of an electrical power distribution structure wherein vias with relatively high electrical resistances are used to electrically couple a capacitor 202 (e.g., a multilayer ceramic capacitor) between a planar power conductor (i.e., a power plane) 204 and a planar ground conductor (i.e., a ground plane) 206 of an interconnecting apparatus 203. Capacitor 202 may be, for example, a bypass capacitor. Interconnecting apparatus 203 may be, for example, a PCB, a component of a semiconductor device package, or formed upon a surface of an integrated circuit substrate.

Interconnecting apparatus 203 includes multiple layers of planar electrical conductors separated by dielectric layers. In the embodiment of FIG. 10, capacitor 202 has two terminals 210 and 212 on opposite ends of a body or package. Terminal 210 is electrically connected to a first solder land 214 by a solder fillet 216. Solder land 214 is electrically coupled to ground plane 206 by a via 218. Terminal 212 is electrically connected to a second solder land 220 by a solder fillet 222. Solder land 220 is electrically coupled to power plane 204 by a via 224.

Solder lands 214 and 220 are formed within a signal plane 208 of interconnecting apparatus 203. Signal plane 208 includes multiple signal lines (i.e., interconnects or traces) used to convey signals within interconnecting apparatus 203. During use of interconnecting apparatus 203, power plane 204 is connected to a power terminal of an electrical power supply at a power entry point of interconnecting apparatus 203, and ground plane 206 is connected to a ground terminal of the power supply at the power entry point. Power plane 204 and ground plane 206 provide electrical power to electronic devices connected between power plane 204 and ground plane 206.

In the embodiment of FIG. 10, vias 218 and 224 are formed from a material having an electrical resistivity higher than that of conventional via-forming materials in order to increase a mounted resistance $R_m$ of capacitor 202. It is noted that the mounted inductance $L_m$ of capacitor 202 would not be expected to change substantially over a corresponding conventional structure as only vias 218 and 224 are modified, and the physical dimensions of the current loop coupling capacitor 202 between power plane 204 and ground plane 206 are not increased substantially over the corresponding conventional structure.

Capacitor 202 may be, for example, one of n capacitors coupled between power plane 204 and ground plane 206 to stabilize the electrical impedance of the electrical distribution structure including power plane 204 and ground plane 206. A target electrical impedance $Z_t$ may be used to determine a required value of mounted resistance $R_{m-req}$ for the n capacitors according to:

$$R_{m-req} = n \cdot Z_t$$

Capacitor 202 may have an ESR which is less than the required value of mounted resistance $R_{m-req}$. In this situation, the combined electrical resistance values of vias 218 and 224 may be selected such that the mounted resistance $R_m$ of capacitor 202 is equal to the required value of mounted resistance $R_{m-req}$. This may be accomplished by determining the mounted resistance $R_m$ of capacitor 202 when the electrical resistances of vias 218 and 224 are both zero. The mounted resistance $R_m$ of capacitor 202 when the electrical resistances of vias 218 and 224 are both zero may be equal to the sum of the ESR of capacitor 202 and the electrical resistances of all conductors coupling the capacitor between the planar conductors (e.g., the electrical resistances of solder lands 214 and 220, and power plane 204 between via 218 and via 224 due to the length of the capacitor 202 package). The combined electrical resistances of vias 218 and 224 may be determined by subtracting the mounted resistance $R_m$ of capacitor 202 when the electrical resistances of vias 218 and 224 are both zero from the required value of mounted resistance $R_{m\text{-}req}$.

Figure 11:
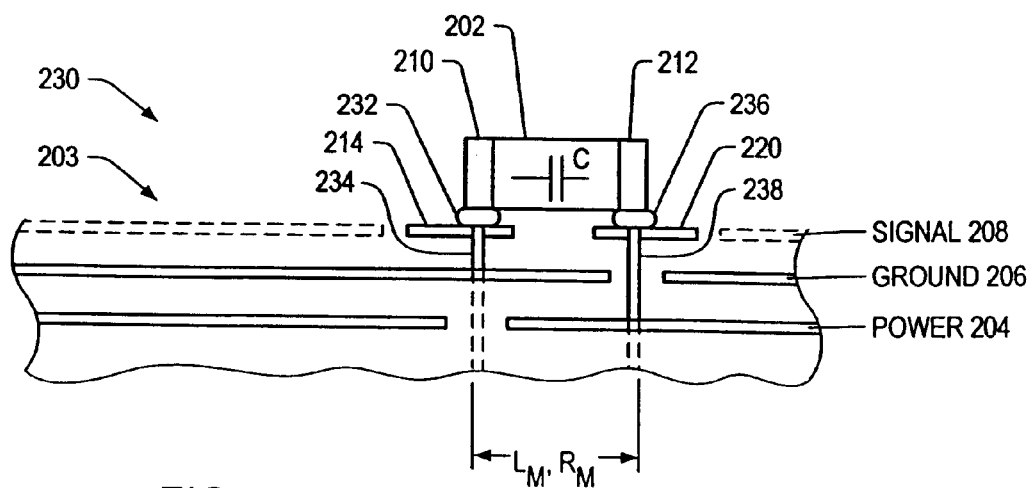
FIG. 11 is a cross sectional view of a portion of an electrical power distribution structure wherein an electrically resistive adhesive material is used to electrically couple a capacitor between a power plane and a ground plane of an interconnecting apparatus.

FIG. 11 is a cross sectional view of a portion 230 of an electrical power distribution structure wherein an electrically resistive adhesive material is used to electrically couple capacitor 202 between power plane 204 and ground plane 206 of interconnecting apparatus 203. Components of the electrical power distribution structure shown in FIG. 10 and described above are labeled similarly in FIG. 11.

In the embodiment of FIG. 11, terminal 210 of capacitor 202 is electrically connected to first solder land 214 by a first amount of an electrically resistive adhesive material 232. Solder land 214 is electrically coupled to ground plane 206 by a via 234. Terminal 212 is electrically connected to a second solder land 220 by a second amount of the electrically resistive adhesive material 236. Solder land 220 is electrically coupled to power plane 204 by a via 238.

In the embodiment of FIG. 11, the first amount of the electrically resistive adhesive material 232 and the second amount of the electrically resistive adhesive material 236 have electrical resistivities higher than that of conventional solder fillets in order to increase mounted resistance $R_m$ of capacitor 202. It is noted that the mounted inductance $L_m$ of capacitor 202 would not be expected to change substantially over a corresponding conventional structure as only the mechanisms for attaching terminals 210 and 212 of capacitor 202 to respective solder lands 214 and 220 are modified, and the physical dimensions of the current loop coupling capacitor 202 between power plane 204 and ground plane 206 are not increased substantially over the corresponding conventional structure.

In the embodiment of FIG. 11, capacitor 202 may be one of n capacitors coupled between power plane 204 and ground plane 206 to stabilize the electrical impedance of the electrical distribution structure including power plane 204 and ground plane 206. A target electrical impedance $Z_t$ may be used to determine a required value of mounted resistance $R_{m\text{-}req}$ for the n capacitors according to:

$$R_{m\text{-}req} = n \cdot Z_t$$

Capacitor 202 may have an ESR which is less than the required value of mounted resistance $R_{m\text{-}req}$. In this situation, the combined electrical resistance values of the first amount of the electrically resistive adhesive material 232 and the second amount of the electrically resistive adhesive material 236 may be selected such that the mounted resistance $R_m$ of capacitor 202 is equal to the required value of mounted resistance $R_{m\text{-}req}$. This may be accomplished by determining the mounted resistance $R_m$ of capacitor 202 when the electrical resistances of the first amount of the electrically resistive adhesive material 232 and the second amount of the electrically resistive adhesive material 236 are both zero. The mounted resistance $R_m$ of capacitor 202 when the electrical resistances of the first amount of the electrically resistive adhesive material 232 and the second amount of the electrically resistive adhesive material 236 are both zero may be equal to the sum of the ESR of capacitor 202 and the electrical resistances of all conductors coupling the capacitor between the planar conductors (e.g., the electrical resistances of solder lands 214 and 220, and power plane 204 between via 234 and via 238 due to the length of the capacitor 202 package). The combined electrical resistances of the first amount of the electrically resistive adhesive material 232 and the second amount of the electrically resistive adhesive material 236 may be determined by subtracting the mounted resistance $R_m$ of capacitor 202 when the electrical resistances of the first amount of the electrically resistive adhesive material 232 and the second amount of the electrically resistive adhesive material 236 are both zero from the required value of mounted resistance $R_{m\text{-}req}$.

Figure 12:
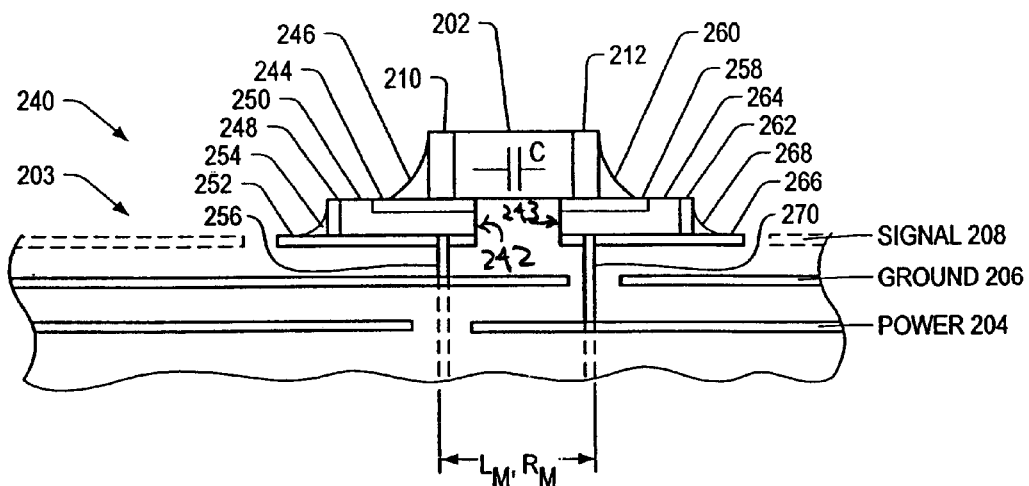
FIG. 12 is a cross sectional view of a portion of an electrical power distribution structure wherein a resistive coupon is positioned between a capacitor and an interconnecting apparatus, and wherein an electrical resistance offered by the resistive coupon is electrically coupled in series with the capacitor between a power plane and a ground plane of the interconnecting apparatus.

FIG. 12 is a cross sectional view of a portion 240 of an electrical power distribution structure wherein a resistive coupon 242 is positioned between capacitor 202 and interconnecting apparatus 203, and wherein an electrical resistance offered by resistive coupon 242 is electrically coupled in series with capacitor 202 between power plane 204 and ground plane 206 of interconnecting apparatus 203. Components of the electrical power distribution structure shown in FIGS. 10–11 and described above are labeled similarly in FIG. 12.

In the embodiment of FIG. 12, terminal 210 of capacitor 202 is electrically connected to a solder land 244 on an upper surface of resistive coupon 242 by a solder fillet 246. Solder land 244 is electrically coupled to a side terminal 248 on a side surface of resistive coupon 242 via a first resistive region 250 of resistive coupon 242. Side terminal 248 of resistive coupon 242 is electrically connected to a solder land 252 of interconnecting apparatus 203 by a solder fillet 254. Solder land 252 of interconnecting apparatus 203 is electrically connected to ground plane 206 by a via 256.

Terminal 212 of capacitor 202 is electrically connected to a solder land 258 on the upper surface of resistive coupon 243 by a solder fillet 260. Solder land 258 is electrically coupled to a side terminal 262, on a side surface of resistive coupon 243 opposite side terminal 248, via a second resistive region 264 of resistive coupon 243. Side terminal 262 of resistive coupon 243 is electrically connected to a solder land 266 of interconnecting apparatus 203 by a solder fillet 268. Solder land 266 of interconnecting apparatus 203 is electrically connected to power plane 204 by a via 270.

In the embodiment of FIG. 12, the first resistive region 250 and the second resistive region 264 of the respective resistive coupons 242 and 243 have electrical resistivities higher than that of conventional solder fillets in order to increase mounted resistance $R_m$ of capacitor 202. It is noted that the mounted inductance $L_m$ of capacitor 202 would not be expected to change substantially over a corresponding conventional structure as physical dimensions of the resistive coupons 242 and 243 may be relatively small, and thus the physical dimensions of the current loop coupling capacitor 202 between power plane 204 and ground plane 206 may not be increased substantially over the corresponding conventional structure.

In the embodiment of FIG. 12, capacitor 202 may be one of n capacitors coupled between power plane 204 and ground plane 206 to stabilize the electrical impedance of the electrical distribution structure including power plane 204 and ground plane 206. As described above, a target electrical impedance $Z_t$ may be used to determine a required value of mounted resistance $R_{m\text{-}req}$ for the n capacitors according to:

$$R_{m\text{-}req} = n \cdot Z_t$$

Capacitor 202 may have an ESR which is less than the required value of mounted resistance $R_{m\text{-}req}$. In this situation, the combined electrical resistance values of the first resistive region 250 and the second resistive region 264 of the respective resistive coupons 242 and 243 may be selected such that the mounted resistance $R_m$ of capacitor 202 is equal to the required value of mounted resistance $R_{m-req}$. This may be accomplished by determining the mounted resistance $R_m$ of capacitor 202 when the electrical resistances of the first resistive region 250 and the second resistive region 264 are both zero. The mounted resistance $R_m$ of capacitor 202 when the electrical resistances of the first resistive region 250 and the second resistive region 264 are both zero may be equal to the sum of the ESR of capacitor 202 and the electrical resistances of all conductors coupling the capacitor between the planar conductors (e.g., the electrical resistances of solder lands 252 and 266, and power plane 204 between via 256 and via 270 due to the length of the capacitor 202 package). The combined electrical resistances of the first resistive region 250 and the second resistive region 264 may be determined by subtracting the mounted resistance $R_m$ of capacitor 202 when the electrical resistances of the first resistive region 250 and the second resistive region 264 are both zero from the required value of mounted resistance $R_{m-req}$.

Figure 13:
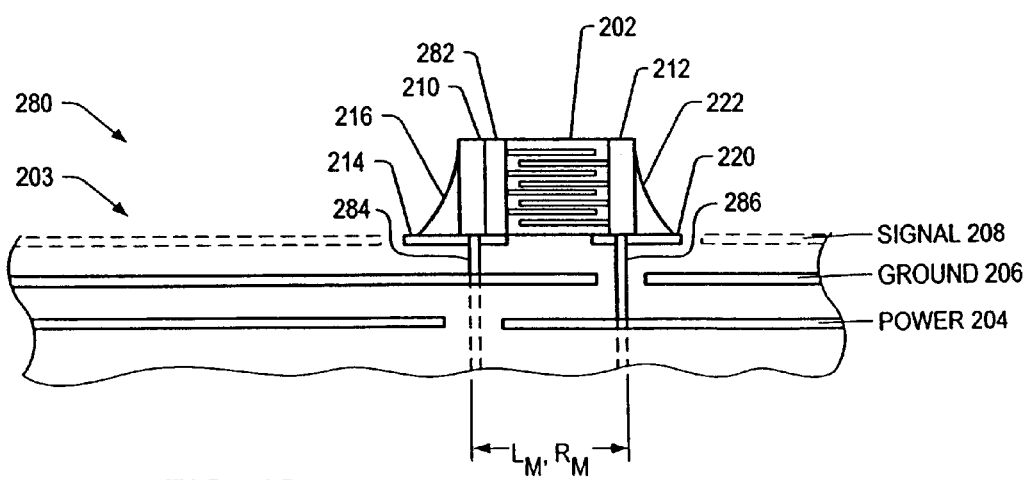
FIG. 13 is a cross sectional view of a portion of an electrical power distribution structure wherein a capacitor is electrically coupled between a power plane and a ground plane of an interconnecting apparatus, and wherein the capacitor includes a single electrical resistance element in series with a capacitance element.
Figure 23:
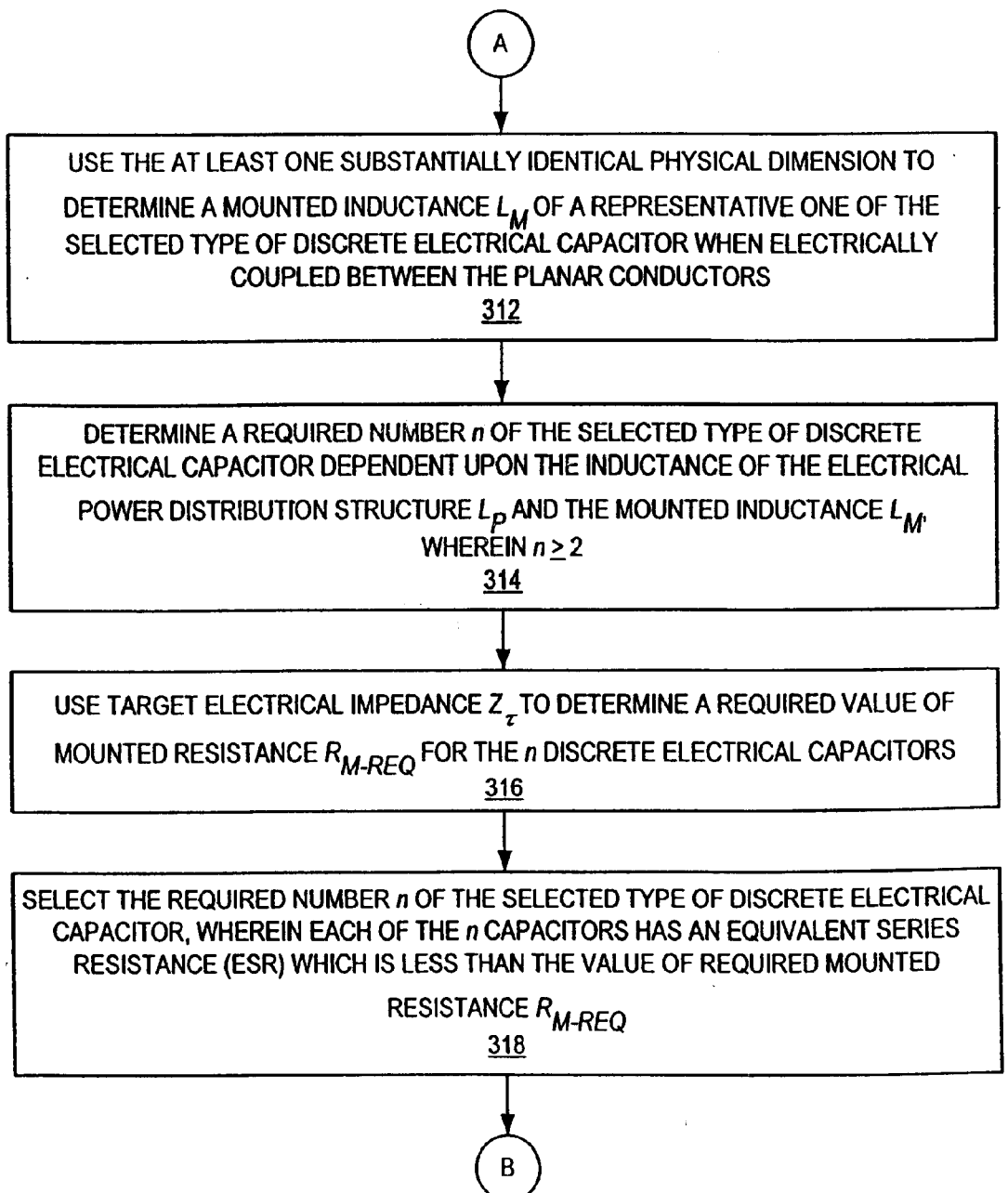
Figure 23:
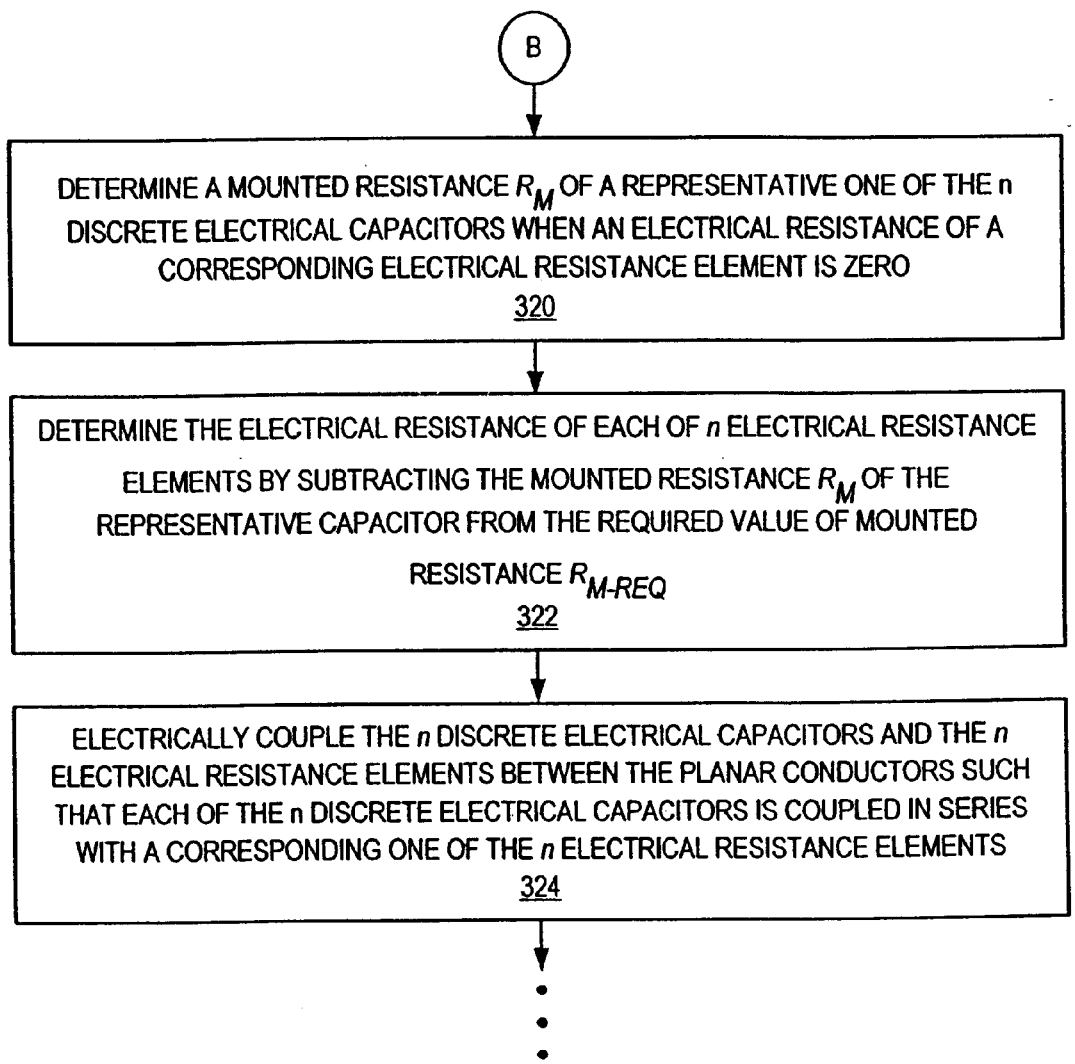
Figure 24A:
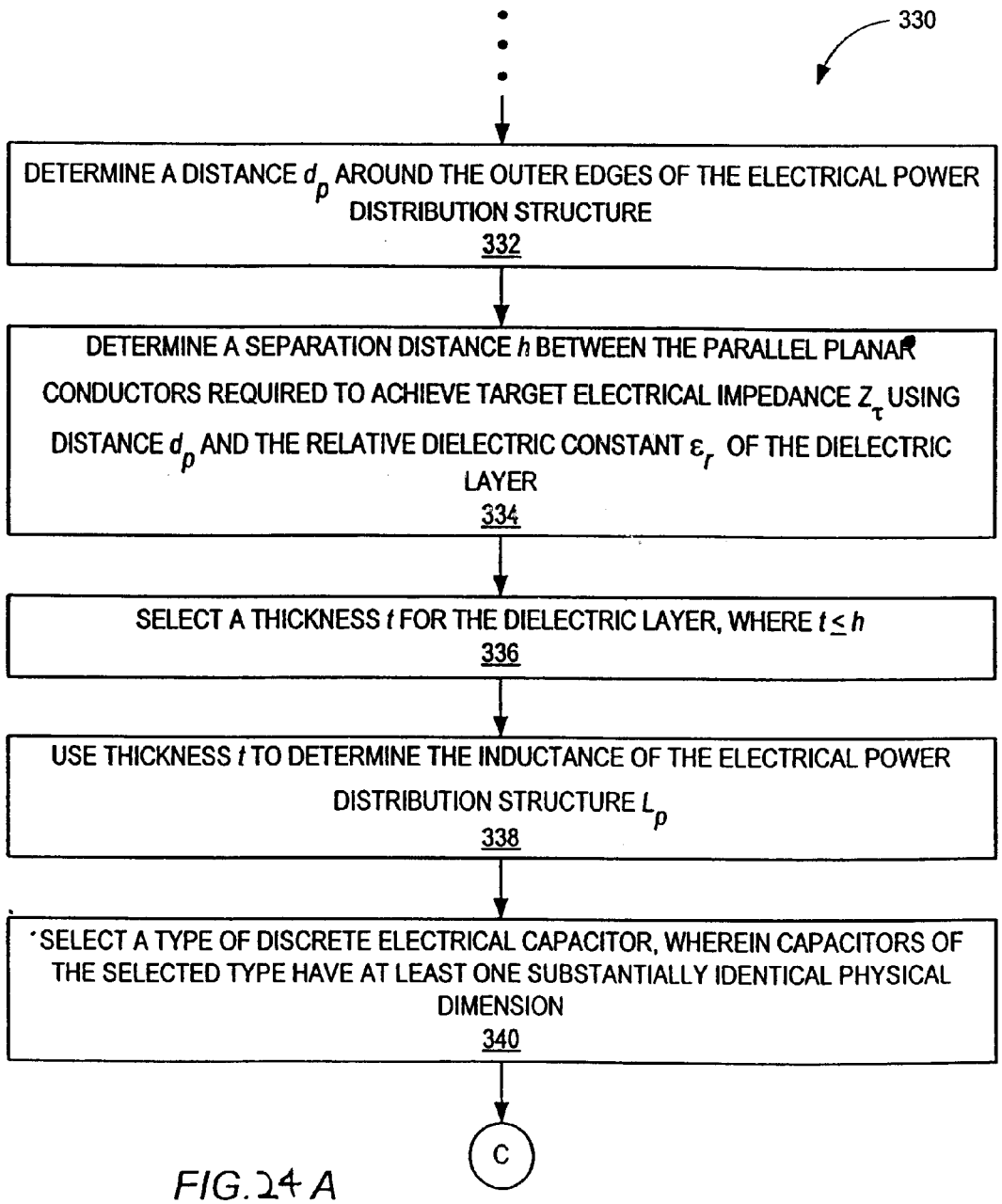
FIGS. 24A–24F in combination form a flow chart of one embodiment of a second method for achieving a target electrical impedance $Z_t$ in an electrical power distribution structure including a pair of parallel planar conductors separated by a dielectric layer.
Figure 24:
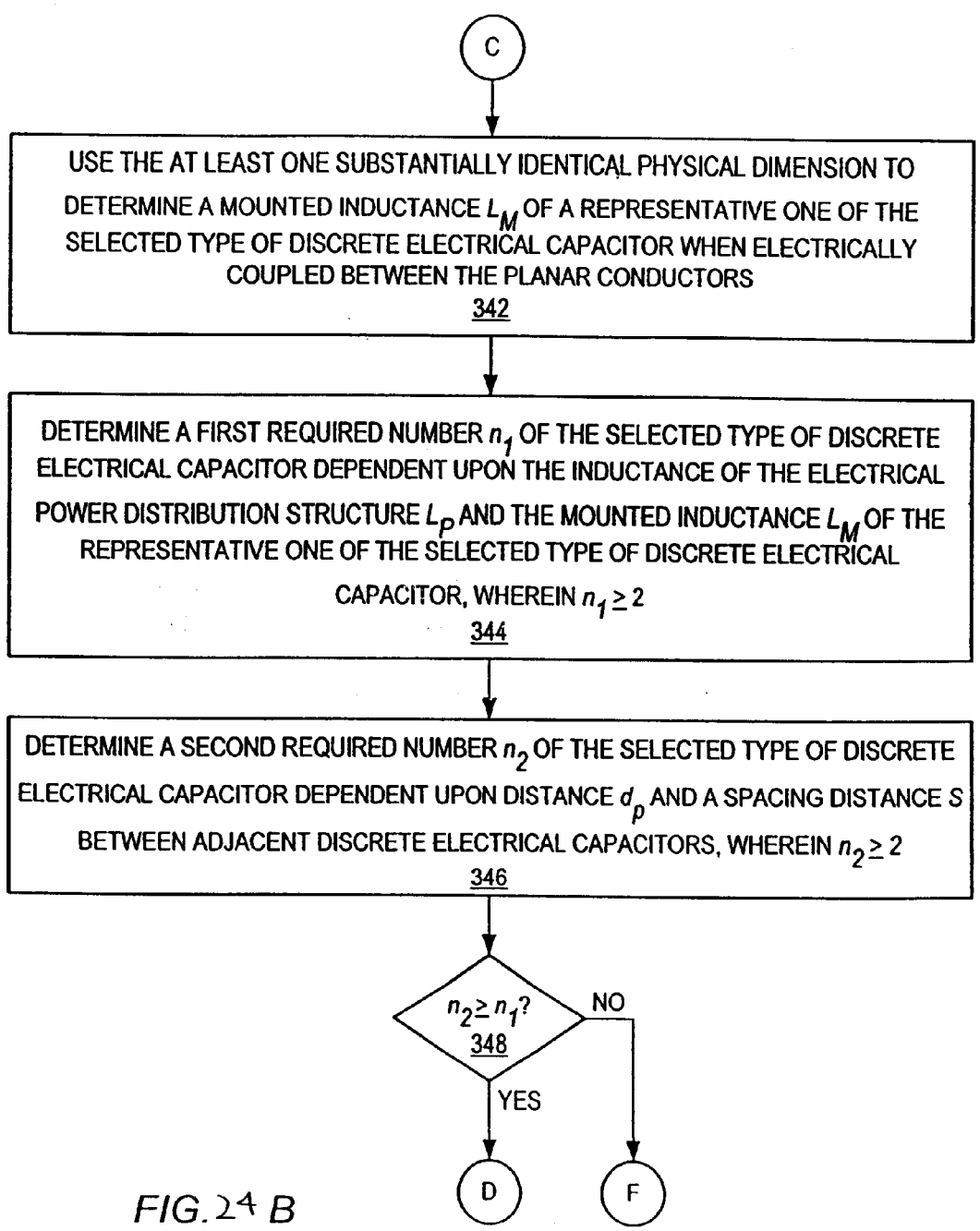
Figure 24:
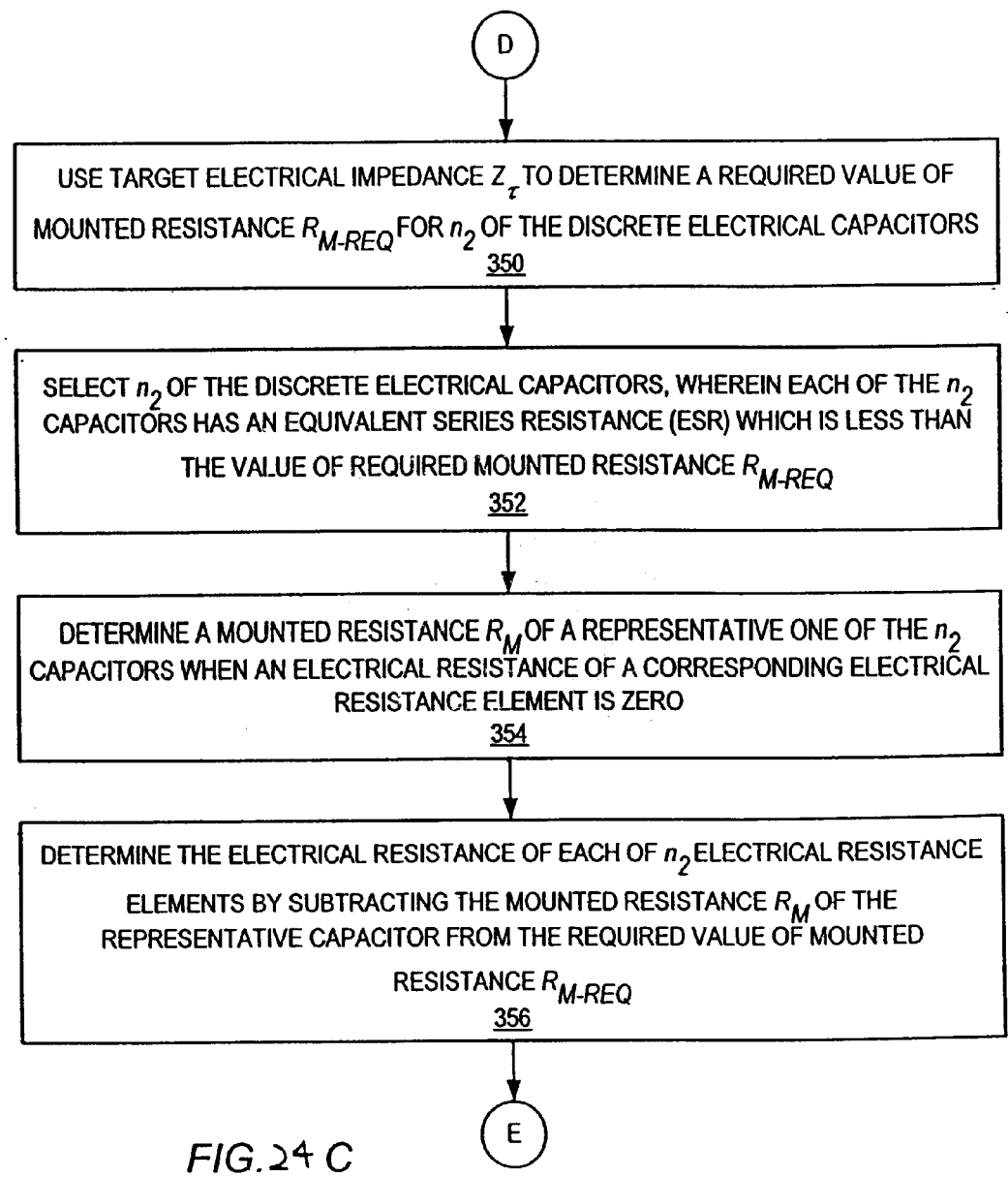
Figure 24D:
Figure 24D:
Figure 24E:
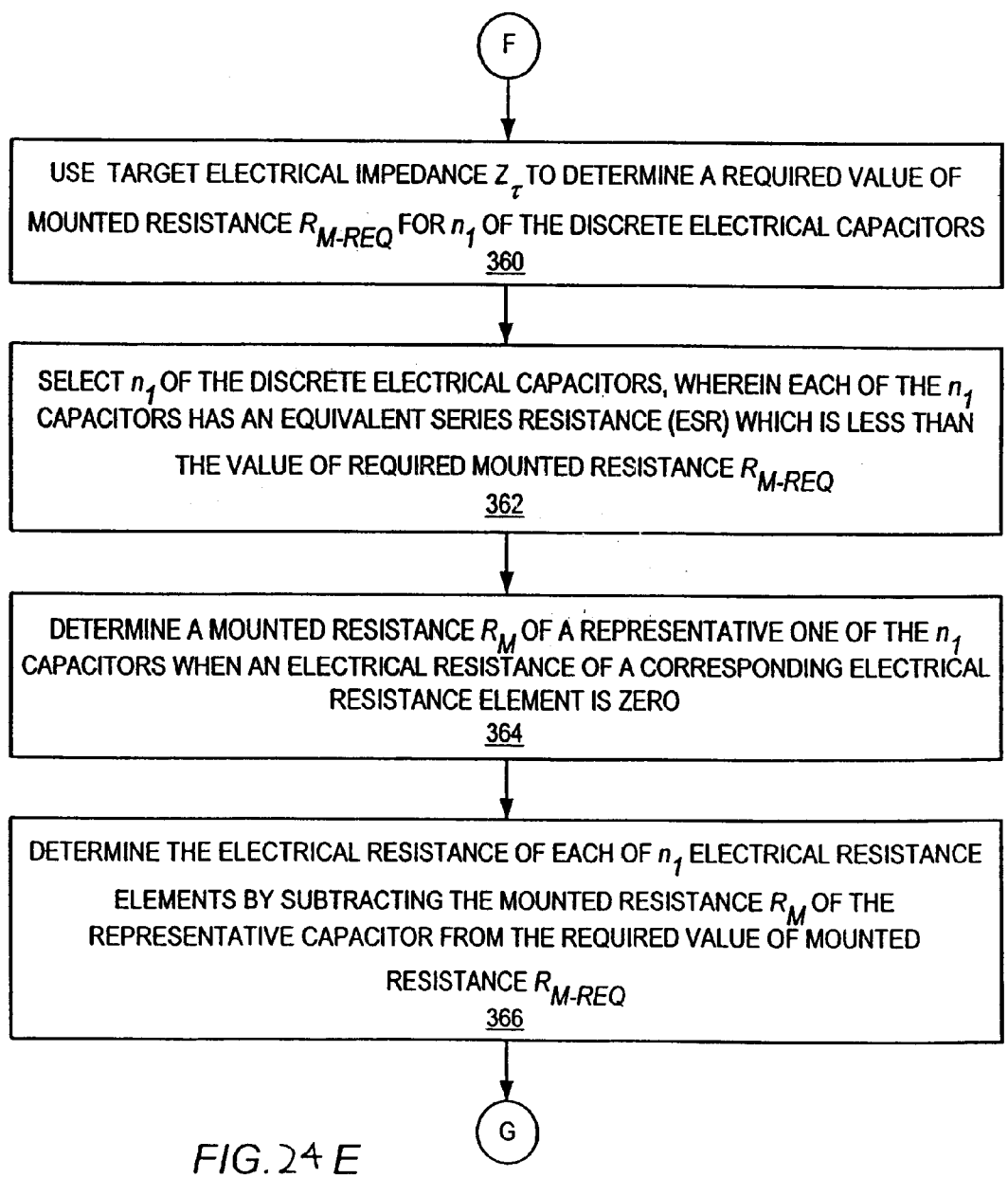

FIG. 13 is a cross sectional view of a portion 280 of an electrical power distribution structure wherein capacitor 202 is electrically coupled between power plane 204 and ground plane 206 of interconnecting apparatus 203, and wherein capacitor 202 includes an electrical resistance element 282 in series with a capacitance element. Components of the electrical power distribution structure shown in FIGS. 22–24 and described above are labeled similarly in FIG. 25A.

In the embodiment of FIG. 13, in addition to terminals 210 and 212, capacitor 202 includes two interleaved sets of conductive plates arranged in parallel and separated by a dielectric. One of the two sets of conductive plates is electrically connected to terminal 212. The other set of conductive plates is electrically coupled to terminal 210 via internal electrical resistance element 282. Terminal 210 is electrically connected to first solder land 214 by solder fillet 216. Solder land 214 is electrically coupled to ground plane 206 by a via 284. Terminal 212 is electrically connected to second solder land 220 by solder fillet 222. Solder land 220 is electrically coupled to power plane 204 by a via 286.

In the embodiment of FIG. 13, electrical resistance element 282 is formed from a material having a relatively high electrical resistivity (e.g., higher than that of a metal conductor) in order to increase mounted resistance $R_m$ of capacitor 202. It is noted that the mounted inductance $L_m$ of capacitor 202 would not be expected to change substantially over a corresponding conventional structure as the physical the length of the capacitor 202 package may not be increased significantly. Accordingly, the physical dimensions of the current loop coupling capacitor 202 between power plane 204 and ground plane 206 may not be increased substantially over the corresponding conventional structure.

Capacitor 202 may be one of n capacitors coupled between power plane 204 and ground plane 206 to stabilize the electrical impedance of the electrical distribution structure including power plane 204 and ground plane 206. As described above, a target electrical impedance $Z_t$ may be used to determine a required value of mounted resistance $R_{m-req}$ for the n capacitors according to:

$$R_{m-req} = n \cdot Z_t$$

Capacitor 202 may have an ESR which is less than the required value of mounted resistance $R_{m-req}$. In this situation, the electrical resistance of electrical resistance element 282 may be selected such that the mounted resistance $R_m$ of capacitor 202 is equal to the required value of mounted resistance $R_{m-req}$. This may be accomplished by determining the mounted resistance $R_m$ of capacitor 202 when the electrical resistance of electrical resistance element 282 is zero. The mounted resistance $R_m$ of capacitor 202 when the electrical resistance of electrical resistance element 282 is zero may be equal to the sum of the ESR of capacitor 202 and the electrical resistances of all conductors coupling the capacitor between the planar conductors (e.g., the electrical resistances of solder lands 214 and 220, and power plane 204 between via 284 and via 286 due to the length of the capacitor 202 package). The electrical resistance of electrical resistance element 282 may be determined by subtracting the mounted resistance $R_m$ of capacitor 202 when the electrical resistance of electrical resistance element 282 is zero from the required value of mounted resistance $R_{m-req}$. The n capacitors may then be selected having internal electrical resistance elements 282 with electrical resistances substantially equal to the determined value of electrical resistance.

Figure 14A:
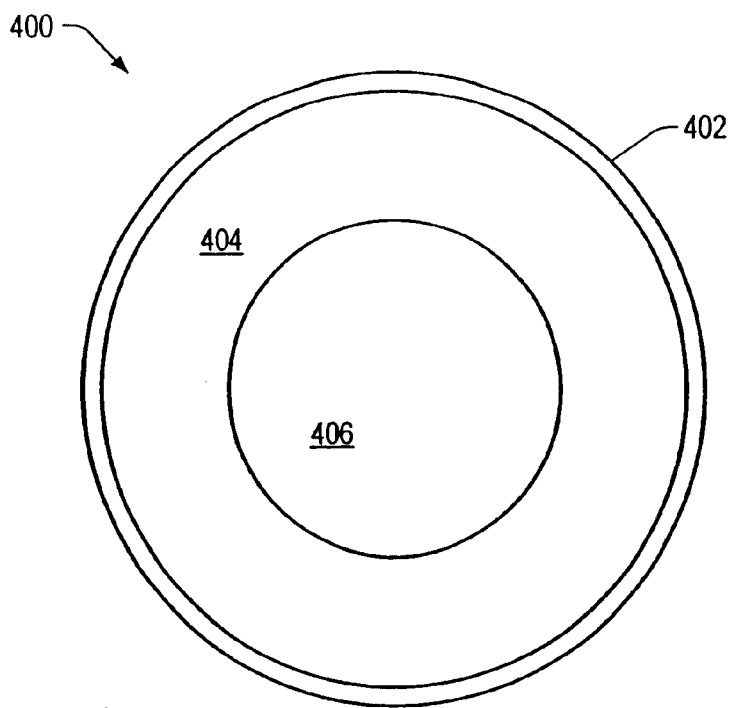
FIG. 14A is a top view of one embodiment of an annular resistor.
Figure 14B:
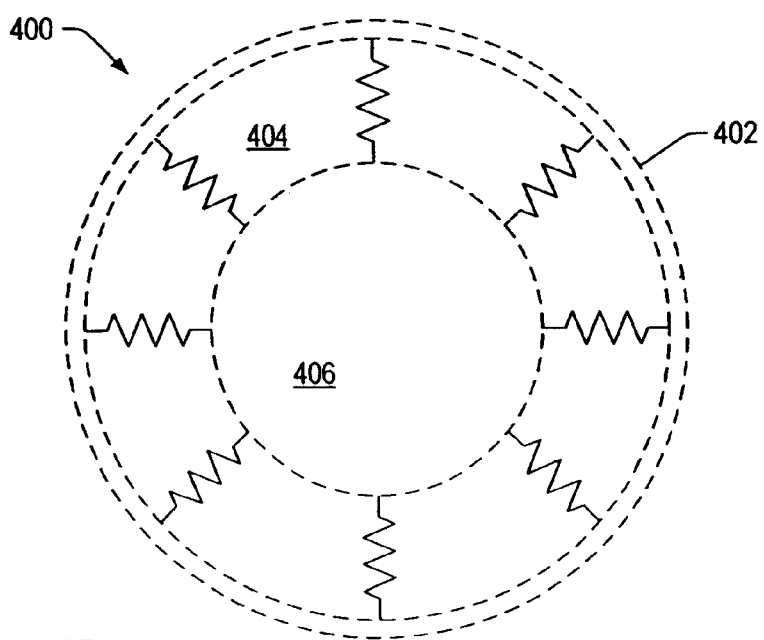
FIG. 14B is a schematic representation of one embodiment of an annular resistor.

FIGS. 14A and 14B are top views of one embodiment of an annular resistor that may be used to provide the resistance in lieu of the resistive elements described above. Annular resistor 400, in one embodiment, is a circularly shaped resistor. In some embodiments, annular resistor 400 may be printed into a planar conductor (e.g. a power plane), while in other embodiments, annular resistor 400 may be a discrete component which may be mounted on a printed circuit board. Annular resistor 400 may also be placed into a void in a planar conductor. Annular resistor 400 includes a first terminal 402 and a second terminal 406. An annular resistor 404 may be arranged between first terminal 402 and second terminal 406. In various embodiments, the first terminal may be the outer periphery of the annular resistor 404. Similarly, in some embodiments, the second terminal may be the inner periphery of the annular resistor 404. As shown in FIG. 14B, the annular resistor may be considered, from an electrical model point of view, to be a plurality of resistors connected in parallel between the first terminal 402 and the second terminal 406.

Figure 15:
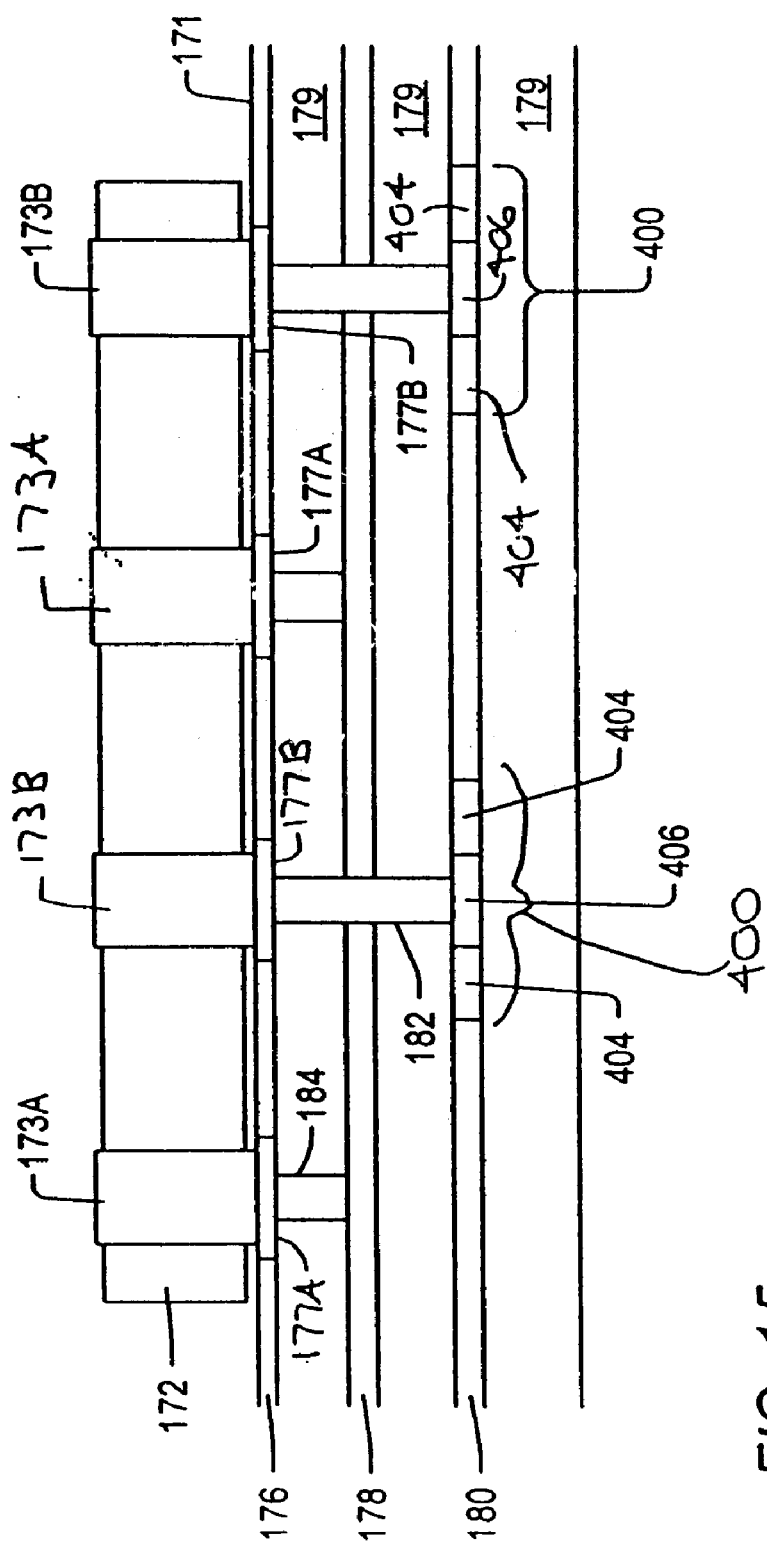
FIG. 15 is a side view of a one embodiment of a multi-terminal capacitor mounted on a printed circuit board, wherein some of the capacitor terminals are electrically connected to a ground plane, and some of the terminals are electrically connected to annular resistors which are printed into a power plane.

Turning now to FIG. 15 a side view of one embodiment of a multi-terminal capacitor, for example an eight terminal capacitor, mounted on a printed circuit board, wherein some of the capacitor terminals are electrically connected to a ground plane, and some of the terminals are electrically connected to annular resistors which are printed into a power plane. Multi-terminal capacitor 172 is mounted upon printed circuit board (PCB) 171. PCB 171 includes a pair of planar conductors, ground plane 178 and power plane 180, both of which are part of an electrical power distribution structure. The pair of planar conductors are separated by dielectric material 179. PCB 171 also includes a plurality of pads 177 located on surface layer 171 for mounting multi-terminal capacitor 172. A plurality of first terminals 173A of multi-terminal capacitor 172 is electrically connected to ground plane 178 through a plurality of first pads 177A and vias 184. A plurality of second terminals 173B is connected to a second terminal 406 of an annular resistor 400 through a plurality of second pads 177B and vias 182.

Multi-terminal capacitor 172 may include a plurality of individual capacitors, or may include a single capacitor which is electrically connected to the plurality of first terminals 173A and the plurality of second terminals 173B. In either case, by connecting the plurality of second terminals 173B to annular resistors 400, a series RC circuit is formed between ground plane 178 and power plane 180, as the first terminals 402 of annular resistors 400 are electrically connected to power plane 180.

Figure 16:
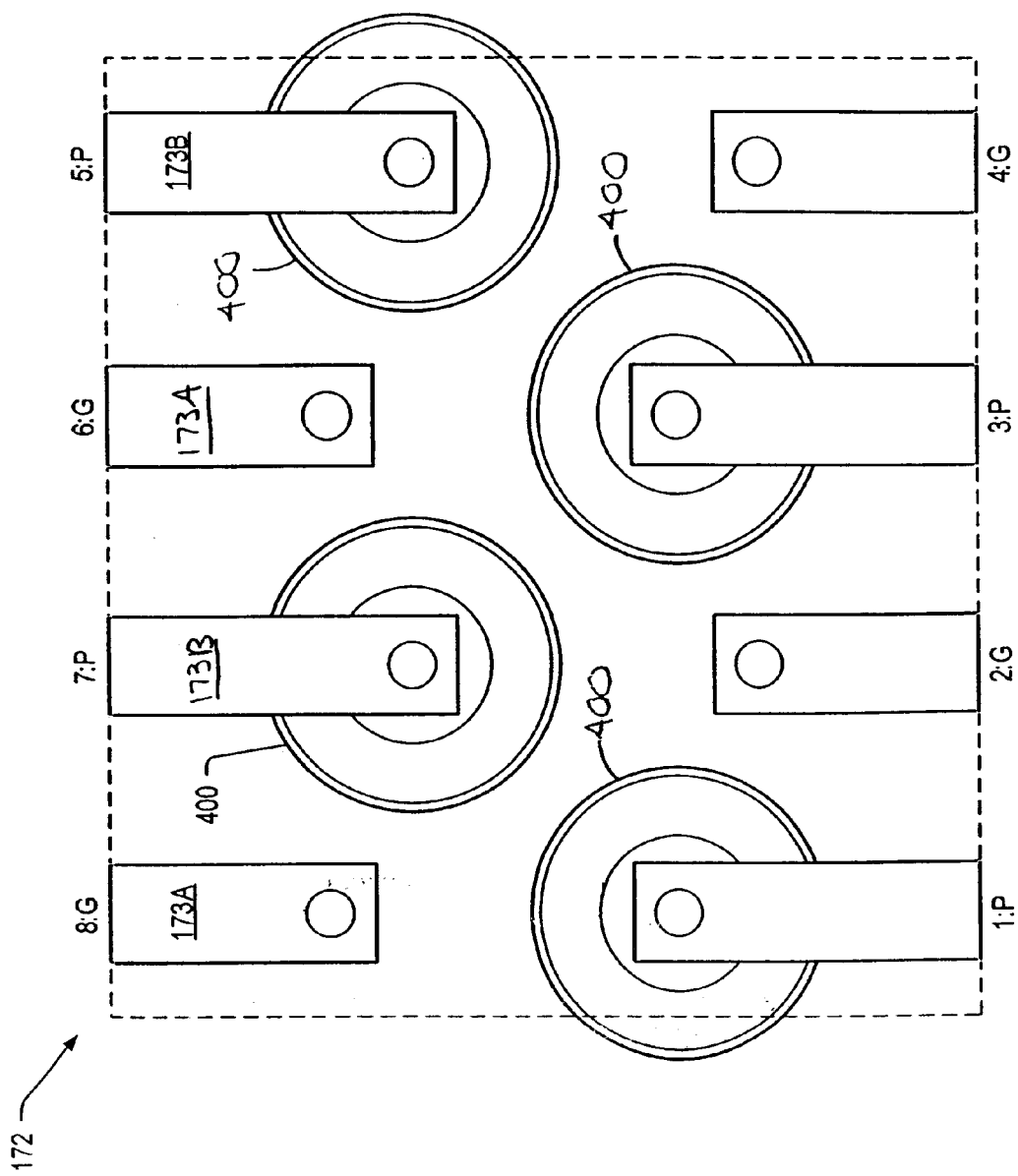
FIG. 16 is a top plan view of one embodiment of a multi-terminal capacitor, wherein a plurality of the capacitor terminals are connected to annular resistors.

Moving now to FIG. 16, a top plan view of one embodiment of a multi-terminal capacitor, wherein a plurality of the capacitor terminals are connected to annular resistors is shown. Multi-terminal capacitor 172 includes a plurality of first leads 173A which are electrically coupled to a ground plane. Each of a plurality of second leads 173B are electrically connected to a terminal of an annular resistor 400. As shown in FIG. 15, annular resistors 400, in this embodiment, are printed into a power plane in such a pattern to allow them to be placed in series with a bypass capacitor that is coupled to the ground plane. In other embodiments, the annular resistors may be arranged in different patterns provided there is sufficient space between them.

Turning now to FIG. 17 a side view of a second embodiment of an exemplary four-terminal capacitor mounted on a printed circuit board, wherein some of the capacitor terminals are electrically connected to a ground plane, and some of the terminals are electrically connected to annular resistors which are printed into a power plane. Four-terminal capacitor 500 is mounted upon printed circuit board (PCB) 502. PCB 502 includes a pair of planar conductors, ground plane 504 and power plane 506, both of which are part of an electrical power distribution structure. The pair of planar conductors are separated by dielectric material 508. PCB 502 also includes a plurality of pads 510 located on surface layer 512 for mounting the four-terminal capacitor 500. Two first terminals 514A of the four-terminal capacitor 500 are electrically connected to the ground plane 504 through a plurality of first pads 510A and vias 516. Two second terminals 514B are connected to a second terminal 518 of respective annular resistors 520 through a plurality of second pads 510B and vias 521.

The four-terminal capacitor 500 may include a plurality of individual capacitors, or may include a single capacitor which is electrically connected to the two first terminals 514A and the two second terminals 514B. In either case, by connecting the two second terminals 514B to respective annular resistors 520, a series RC circuit is formed between the ground plane 504 and the power plane 506, as first terminals 522 of annular resistors 520 are electrically connected to the power plane 506.

Moving now to FIG. 18, a top plan view is shown of the second embodiment of the four-terminal capacitor, wherein two of the capacitor terminals are connected to annular resistors. The four-terminal capacitor 500 includes the two first terminals 514A which are electrically coupled to the ground plane 504. Each of the two second terminals 514B are electrically connected to the terminal second terminal 518 of a respective annular resistor 520. As shown in FIG. 17, the annular resistors 520, in this embodiment, are printed into the power plane 506 in such a pattern to allow them to be placed in series with a bypass capacitor that is coupled to the ground plane. In other embodiments, the annular resistors may be arranged in different patterns providing there is sufficient space between them.

Figure 19:
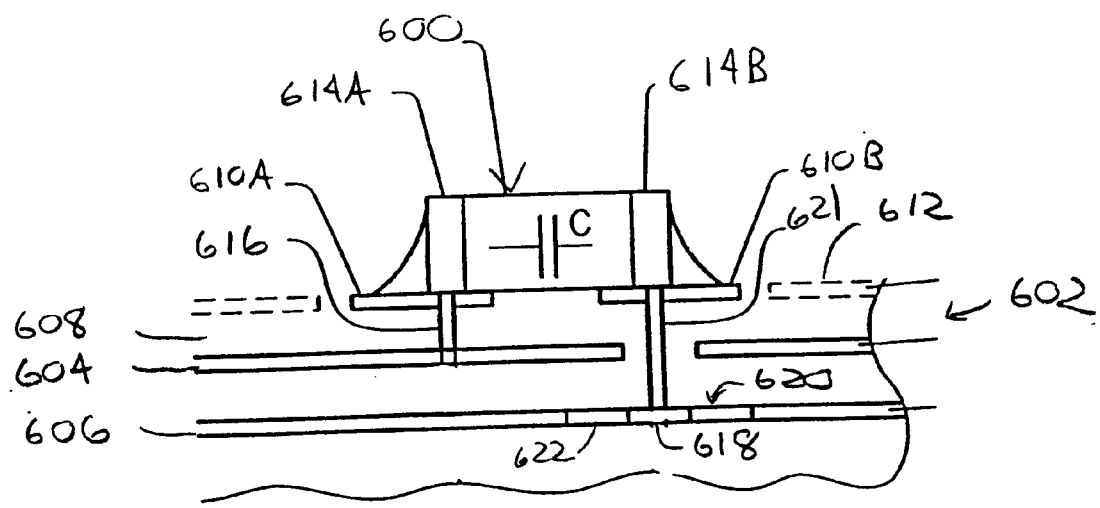
FIG. 19 is a side view of a third embodiment of a two-terminal capacitor mounted on a printed circuit board, wherein one of the capacitor terminals is electrically connected to a ground plane, and the other terminal is electrically connected to an annular resistor which is printed into a power plane.

Turning now to FIG. 19 a side view of a third embodiment of a two-terminal capacitor mounted on a printed circuit board, wherein one of the capacitor terminals is electrically connected to a ground plane, and the other terminal is electrically connected to an annular resistor which is printed into a power plane. Two-terminal capacitor 600 is mounted upon printed circuit board (PCB) 602. PCB 602 includes a pair of planar conductors, ground plane 604 and power plane 606, both of which are part of an electrical power distribution structure. The pair of planar conductors are separated by dielectric material 608. PCB 602 also includes a plurality of pads 610 located on surface layer 612 for mounting the two-terminal capacitor 600. A first terminal 614A of the two-terminal capacitor 600 is electrically connected to the ground plane 604 through a first pad 610A and via 616. A second terminal 614B is connected to a second terminal 618 of an annular resistor 620 through a second pad 610B and via 621.

The two-terminal capacitor 600 is electrically connected to the first terminal 614A and the second terminal 614B. By connecting the second terminal 614B to an annular resistor 620, a series RC circuit is formed between the ground plane 604 and the power plane 606, as the first terminal 622 of the annular resistor 620 is electrically connected to the power plane 606.

Figure 20:
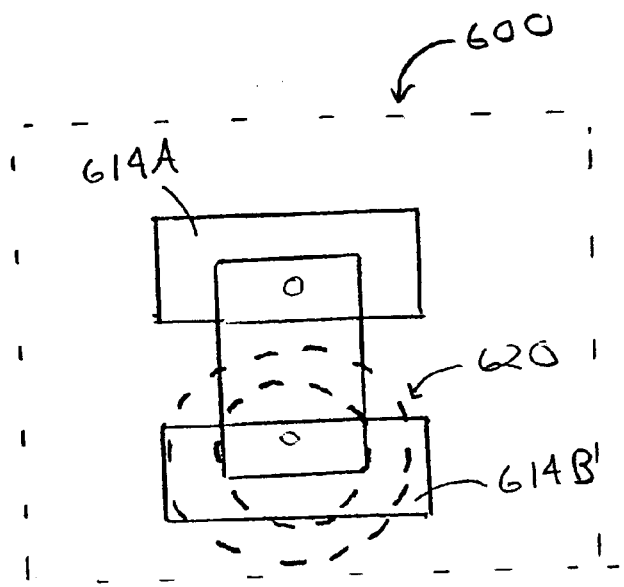
FIG. 20 is a top plan view of the third embodiment of a two-terminal capacitor, wherein one of the capacitor terminals is connected to an annular resistor.

Moving now to FIG. 20, a top plan view is shown of the third embodiment of the two-terminal capacitor, wherein one of the capacitor terminals is connected to an annular resistor. The two-terminal capacitor 600 includes the first terminal 614A which is electrically coupled to the ground plane 604. The second terminal 614B is electrically connected to the second terminal 618 of the annular resistor 620. As shown in FIG. 18, the annular resistor 620, in this embodiment, is printed into the power plane 606 in such a pattern to allow the annular resistor to be placed in series with a bypass capacitor that is coupled to the ground plane.

Figure 21:
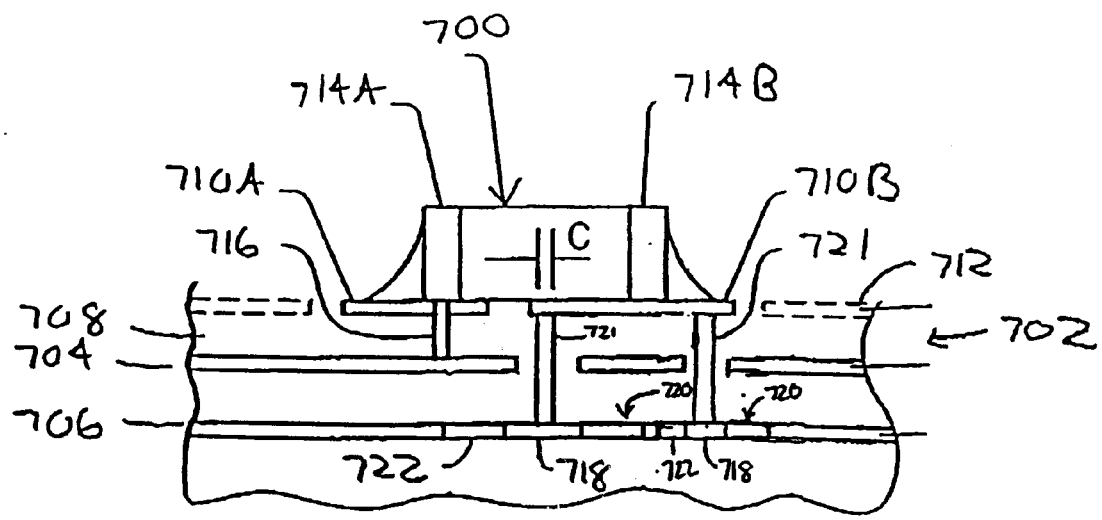
FIG. 21 is a side view of a fourth embodiment of a two-terminal capacitor mounted on a printed circuit board, wherein one of the capacitor terminals is electrically connected to a ground plane, and the other terminal is electrically connected to three annular resistors which are printed into a power plane.

Turning now to FIG. 21 a side view is shown of a fourth embodiment of a two-terminal capacitor mounted on a printed circuit board, wherein one of the capacitor terminals is electrically connected to a ground plane, and the other terminal is electrically connected to three annular resistors which are printed into a power plane. Two-terminal capacitor 700 is mounted upon printed circuit board (PCB) 702. PCB 702 includes a pair of planar conductors, ground plane 704 and power plane 706, both of which are part of an electrical power distribution structure. The pair of planar conductors are separated by dielectric material 708. PCB 702 also includes a plurality of pads 710 located on surface layer 712 for mounting the two-terminal capacitor 700. A first terminal 714A of the two-terminal capacitor 700 is electrically connected to the ground plane 704 through a first pad 710A and via 716. A second terminal 714B is connected to a second terminal 718 of an annular resistor 720 through a second pad 710B and via 721.

The two-terminal capacitor 700 is electrically connected to the first terminal 714A and the second terminal 714B. By connecting the second terminal 714B to three annular resistors 720, a series RC circuit is formed between the ground plane 704 and the power plane 706, as the first terminals 722 of the annular resistors 720 are electrically connected to the power plane 706.

Figure 22:
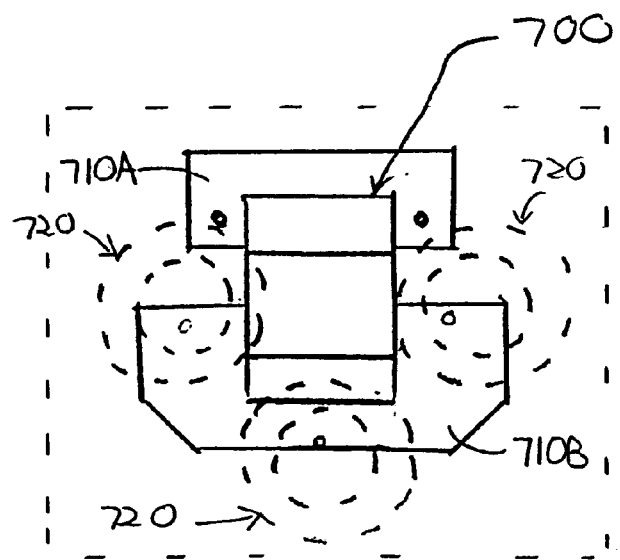
FIG. 22 is a top plan view of a fourth embodiment of a two-terminal capacitor, wherein one of the capacitor terminals is connected to three annular resistors.

Moving now to FIG. 22, a top plan view is shown of the fourth embodiment of the two-terminal capacitor, wherein one of the capacitor terminals is connected to three annular resistors. The two-terminal capacitor 700 includes the first terminal 714A which is electrically coupled to the ground plane 704. Each of three second terminals 714B are electrically connected to the second terminal 718 of a respective one of the three annular resistors 720. As shown in FIG. 20, the annular resistors 720, in this embodiment, are printed into the power plane 706 in such a pattern to allow them to be placed in series with a bypass capacitor that is coupled to the ground plane. In other embodiments, the annular resistors 720 may be arranged in different patterns providing there is sufficient space between them.

While the annular resistors 720 have been shown as being substantially symmetric and annular circles, it is clear that the annular resistors can take on many different forms. These forms can include squares, rectangles, ellipses and the like, in addition to non-symmetrical shapes. The choice of the shape of the annular resistor is based on the design constraints for a particular PCB design including, but not limited to, fabrication tolerances, resistive value requirements and cost.

In addition, the placement of the via connecting the capacitor terminal to the inner periphery of the annular resistor, although shown (in some Figures) as being substantially in the center, is not meant to be limiting. Just as the shape of the annular resistor may vary depending on different factors, the positioning of the via with respect to the inner periphery may also move. As long as the via electrically couples the inner periphery of the annular resistor to the terminal of the capacitor, the location of the via within the inner periphery can be moved to meet PCB design requirements.

Further, while the annular resistor has been shown to be co-planar with the power plane, it is clear that the annular resistor can be manufactured according to other known techniques. These techniques include forming the annular resistor in a void defined by either a ground plane, power plane or signal plane or forming the annular resistor on a respective plane. Still further, the annular resistor can be formed within and in the plane. Examples of such annular resistors can be found in U.S. Pat. No. 5,708,569 issued to Howard, et al. on Jan. 13, 1998 and which is herein fully incorporated by reference.

Figure 23A:
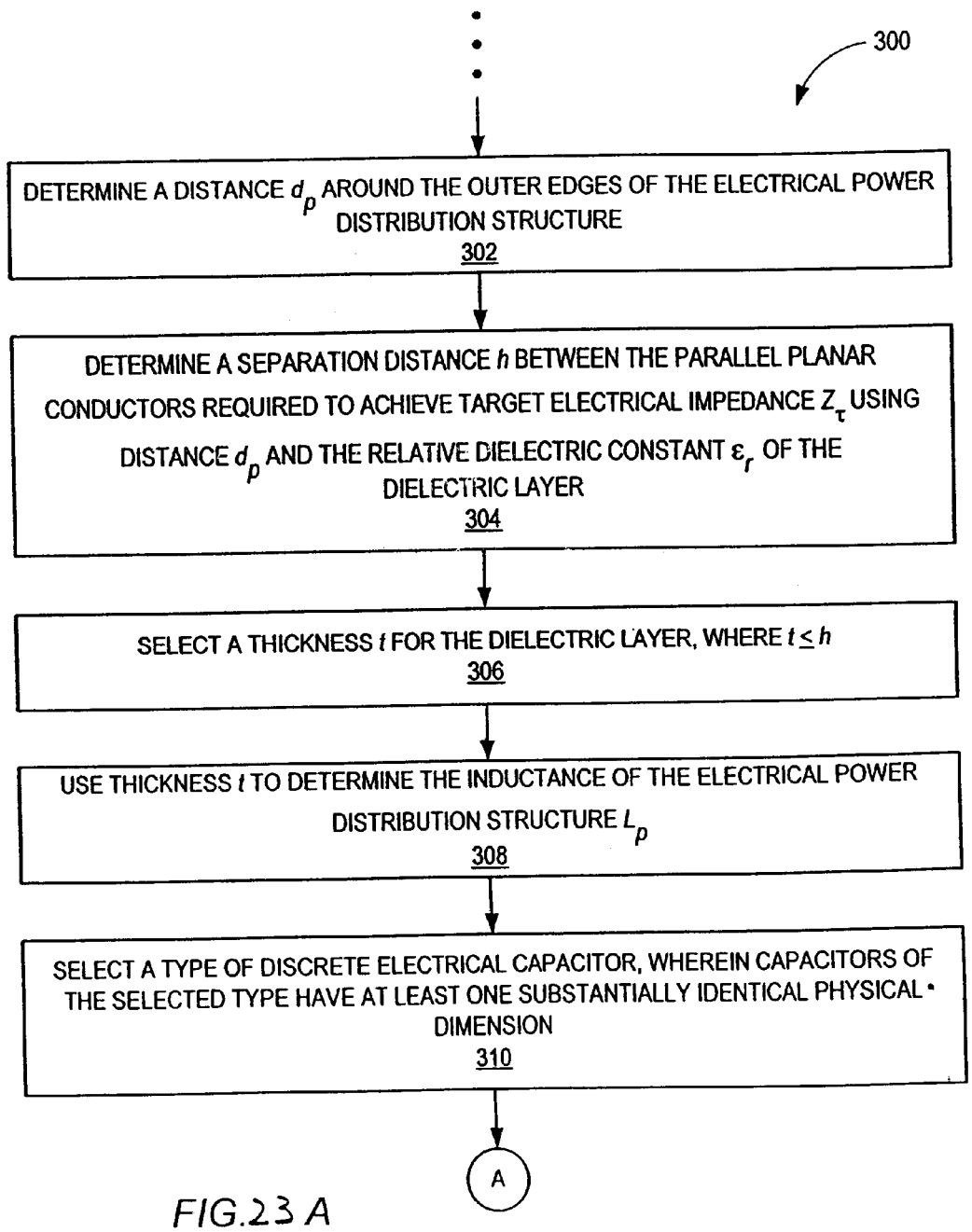
FIGS. 23A–23C in combination form a flow chart of one embodiment of a first method for achieving a target electrical impedance $Z_t$ in an electrical power distribution structure including a pair of parallel planar conductors separated by a dielectric layer.

FIGS. 23A–23C in combination form a flow chart of one embodiment of a first method 300 for achieving a target electrical impedance $Z_t$ in an electrical power distribution structure including a pair of parallel planar conductors separated by a dielectric layer. During a step 302, a distance $d_p$ around the outer edges (i.e., the outer perimeter) of the electrical power distribution structure is determined (e.g., measured) as described above. A separation distance h between the parallel planar conductors required to achieve the target electrical impedance $Z_t$ is determined during a step 304 using distance $d_p$ and the relative dielectric constant $\in_r$ of the dielectric layer. The following equation, based on the above empirical formula for the electrical impedance Zp, may be used to determine separation distance h:

$$h(\text{mils}) = \frac{(Z_t)(\sqrt{\varepsilon_r})(d_p)}{(0.523)}$$

where impedance $Z_t$ is in ohms and distance $d_p$ is in inches.

During a step 306, a thickness t is selected for the dielectric layer, where t≦h. Step 306 reflects the fact that thicknesses of dielectric layers between electrically conductive layers (e.g., copper sheets) of commercially available multi-layer printed circuit boards are typically selected from a range of available thicknesses. It is very likely that the above empirical formula for h will yield a required separation distance which lies between two available thickness within the range of available thicknesses. Assume, for example, that the above empirical formula for h yields a required separation distance which lies between a first available thickness and second available thickness, where the first available thickness is greater than the second available thickness. In this situation, selected thickness t may be the second available thickness such that t≦h.

During a step 308, the selected dielectric layer thickness t is used to determine the inductance $L_p$ of the electrical power distribution structure. The following equation may be used to calculate inductance $L_p$:

$$L_p = (\mu_0 \cdot t)$$

wherein $\mu_0$ is the permeability of free space. It is noted that the dielectric material used to form the dielectric layer is assumed to be non-magnetic such that the relative permeability $\mu_r$ of the dielectric layer is substantially unity.

A type of discrete electrical capacitor is selected during a step 310, wherein capacitors of the selected type have at least one substantially identical physical dimension (e.g., a length of the capacitor package between terminals) upon which a mounted inductance of the capacitors is dependent. During a step 312, the at least one substantially identical physical dimension is used to determine a mounted inductance $L_m$ of a representative one of the selected type of discrete electrical capacitor when the representative capacitor is electrically coupled between the planar conductors. The mounted inductance $L_m$ of the representative discrete electrical capacitor is the electrical inductance resulting from the coupling of the capacitor between the planar conductors.

During a step 314, a required number n of the selected type of discrete electrical capacitor is determined dependent upon the inductance of the electrical power distribution structure $L_p$ and the mounted inductance $L_m$, wherein n≧2. The required number n of the selected type of discrete electrical capacitor may be determined using:

$$n = \frac{L_m}{(0.2 \cdot L_p)}$$

The target electrical impedance $Z_t$ is used during a step 316 to determine a required value of mounted resistance $R_{m-req}$ for the n discrete electrical capacitors. The required value of mounted resistance $R_{m-req}$ may be determined using:

$$R_{m-req} = n \cdot Z_t$$

During a step 318, the required number n of the selected type of discrete electrical capacitor are selected, wherein each of the n capacitors has an equivalent series resistance (ESR) which is less than the required value of mounted resistance $R_{m-req}$. During a step 320, a mounted resistance $R_m$ of a representative one of the n discrete electrical capacitors is determined when an electrical resistance of a corresponding electrical resistance element is zero. The electrical resistance of each of n electrical resistance elements is determined during a step 322 by subtracting the mounted resistance $R_m$ of the representative capacitor from the required value of mounted resistance $R_{m-req}$. During a step 324, the n discrete electrical capacitors and the n electrical resistance elements are electrically coupled between the planar conductors such that each of the n discrete electrical capacitors is coupled in series with a corresponding one of the n electrical resistance elements.

It is noted that during step 306, it is possible that the above empirical formula for h will yield a required separation distance which is less than a minimum available thickness. For example, a minimum thickness of dielectric layers for manufactured printed circuit boards may be 2 mils. If the above empirical formula for h yields a required separation distance which is less than 2 mils, it is possible to add additional pairs of parallel planar conductors to the electrical power distribution structure such that an equivalent thickness t between a representative single pair of parallel planar conductors is achieved. In general, for a structure having n pairs of parallel planar conductors separated by dielectric layers:

$$t = \frac{1}{\sum_{i=1}^{n} \frac{1}{t_i}}$$

where $t_i$ is the thickness of the dielectric layer between the ith pair of the n pairs. The thickness of the dielectric layer between the n pairs of parallel planar conductors may be selected from the range of available thicknesses such that the resulting value of t is less than or equal to h.

FIGS. 24A–24F in combination form a flow chart of one embodiment of a second method 330 for achieving a target electrical impedance $Z_t$ in an electrical power distribution structure including a pair of parallel planar conductors separated by a dielectric layer. During a step 332, a distance $d_p$ around the outer edges (i.e., the outer perimeter) of the electrical power distribution structure is determined (e.g., measured) as described above. A separation distance h between the parallel planar conductors required to achieve the target electrical impedance $Z_t$ is determined during a step 334 using distance $d_p$ and the relative dielectric constant $\in_r$ of the dielectric layer. The following equation, based on the above empirical formula for electrical impedance Zp, may be used to determine separation distance h:

$$h(\text{mils}) = \frac{(Z_t)(\sqrt{\varepsilon_r})(d_p)}{(0.523)}$$

where impedance $Z_t$ is in ohms and distance $d_p$ is in inches.

During a step 336, a thickness t is selected for the dielectric layer, where $t \leq h$. Step 336 reflects the fact that thicknesses of dielectric layers between electrically conductive layers (e.g., copper sheets) of commercially available multi-layer printed circuit boards are typically selected from a range of available thicknesses. As described above, where the empirical formula for h above yields a required separation distance which lies between a first available thickness and second available thickness, and the first available thickness is greater than the second available thickness, selected thickness t may be the second available thickness such that $t \leq h$.

During a step 338, the selected dielectric layer thickness t is used to determine the inductance $L_p$ of the electrical power distribution structure. The following equation may be used to calculate inductance $L_p$:

$$L_p = (\mu_0 \cdot t)$$

wherein $\mu_0$ is the permeability of free space. Again, it is noted that the dielectric material used to form the dielectric layer is assumed to be non-magnetic such that the relative permeability $\mu_r$ of the dielectric layer is substantially unity.

A type of discrete electrical capacitor is selected during a step 340, wherein capacitors of the selected type have at least one substantially identical physical dimension (e.g., a length of the capacitor package between terminals) upon which a mounted inductance of the capacitors is dependent. During a step 342, the at least one substantially identical physical dimension is used to determine a mounted inductance $L_m$ of a representative one of the selected type of discrete electrical capacitors when the representative capacitor is electrically coupled between the planar conductors. Again, the mounted inductance $L_m$ of the representative discrete electrical capacitor is the electrical inductance resulting from the coupling of the capacitor between the planar conductors.

During a step 344, a first required number $n_1$ of discrete electrical capacitors is determined dependent upon the inductance of the electrical power distribution structure $L_p$ and the mounted inductance $L_m$ of the selected type of discrete electrical capacitor when electrically coupled between the planar conductors, wherein $n_1 \leq 2$. The first required number $n_1$ may be determined using:

$$n_1 = \frac{L_m}{(0.2 \cdot L_p)}$$

A second required number $n_2$ of the selected type of discrete electrical capacitor is determined during a step 346 dependent upon distance $d_p$ and a spacing distance S between adjacent discrete electrical capacitors, wherein $n_2 \geq 2$. The second required number $n_2$ may be determined using:

$$n_2 = \frac{d_p}{S}$$

The electrical power distribution structure may be part of an electrical interconnecting apparatus (e.g., a printed circuit board). In this situation, spacing distance S may be less than or equal to a maximum spacing distance $S_{max}$, where $S_{max}$ is a fraction of a wavelength of a maximum frequency $f_{max}$ of a frequency range of electrical signals conveyed within the electrical interconnecting apparatus.

During a decision step 348, the first and second required numbers $n_1$ and $n_2$ are compared. If $n_2 \geq n_1$, step 350 is performed next. On the other hand, if $n_1 > n_2$, step 360 is performed next.

During step 350, the target electrical impedance $Z_t$ is used to determine a required value of mounted resistance $R_{m\text{-}req}$ for $n_2$ of the discrete electrical capacitors. The required value of mounted resistance $R_{m\text{-}req}$ for the $n_2$ capacitors may be determined using:

$$R_{m\text{-}req} = n_2 \cdot Z_t$$

The number $n_2$ of the discrete electrical capacitors are selected during step 352, wherein each of the $n_2$ capacitors has an equivalent series resistance (ESR) which is less than the value of required mounted resistance $R_{m\text{-}req}$. During a step 354, a mounted resistance $R_m$ of a representative one of the $n_2$ capacitors is determined when the representative capacitor is coupled between the pair of parallel planar conductors and when an electrical resistance of a corresponding electrical resistance element is zero. The electrical resistance of each of $n_2$ electrical resistance elements is determined during a step 356 by subtracting the mounted resistance $R_m$ of the representative capacitor from the required value of mounted resistance $R_{m\text{-}req}$. During a step 358, the $n_2$ discrete electrical capacitors and the $n_2$ electrical resistance elements are electrically coupled between the planar conductors along an outer perimeter of the parallel planar conductors such that each of the $n_2$ discrete electrical capacitors is coupled in series with a corresponding one of the $n_2$ electrical resistance elements.

During step 360, the target electrical impedance $Z_t$ is used to determine a required value of mounted resistance $R_{m\text{-}req}$ for $n_1$ of the discrete electrical capacitors dependent upon. The required value of mounted resistance $R_{m\text{-}req}$ for the $n_1$ capacitors may be determined using:

$$R_{m\text{-}req} = n_1 \cdot Z_t$$

The number $n_1$ of the discrete electrical capacitors are selected during a step 362, wherein each of the $n_1$ capacitors has an equivalent series resistance (ESR) which is greater than the required value of mounted resistance $R_{m\text{-}req}$. During a step 364, a mounted resistance $R_m$ of a representative one of the $n_1$ capacitors is determined when the representative capacitor is coupled between the pair of parallel planar conductors and when an electrical resistance of a corresponding electrical resistance element is zero. The electrical resistance of each of $n_1$ electrical resistance elements is determined during a step 366 by subtracting the mounted resistance $R_m$ of the representative capacitor from the required value of mounted resistance $R_{m\text{-}req}$. During a step 368, the $n_1$ discrete electrical capacitors and the $n_1$ electrical resistance elements are electrically coupled between the planar conductors such that: (i) each of the $n_1$ discrete electrical capacitors is coupled in series with a corresponding one of the $n_1$ electrical resistance elements, (ii) $n_2$ of the discrete electrical capacitors and the corresponding electrical resistance elements are positioned along an outer perimeter of the planar conductors, and (iii) the remaining $(n_1-n_2)$ capacitors and the corresponding electrical resistance elements are dispersed across a surface of at least one of the planar conductors.

It is noted that during step 336, it is possible that the above empirical formula for h will yield a required separation distance which is less than a minimum available thickness. For example, a minimum thickness of dielectric layers for manufactured printed circuit boards may be 2 mils. If the above empirical formula for h yields a required separation distance which is less than 2 mils, it is possible to add additional pairs of parallel planar conductors to the electrical power distribution structure such that an equivalent thickness t between a representative single pair of parallel planar conductors is achieved. In general, for a structure having n pairs of parallel planar conductors separated by dielectric layers:

$$t = \frac{1}{\sum_{i=1}^{n} \frac{1}{t_i}}$$

where $t_1$, is the thickness of the dielectric layer between the ith pair of the n pairs. The thickness of the dielectric layer between the n pairs of parallel planar conductors may be selected from the range of available thicknesses such that the resulting value of t is less than or equal to h.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

What is claimed is:

1. An electrical power distribution structure comprising:
    a first conductor and a second conductor;
    a capacitor having a first terminal and a second terminal, the first terminal being electrically coupled to the first conductor; and
    an annular resistor electrically coupled in series between the second terminal of the capacitor and the second conductor;
    wherein a sun of a resistance value of the annular resistor and an equivalent series resistance (ESR) value of the capacitor is substantially equal to a required mounted resistance of the capacitor.

2. The electrical power distribution structure as recited in claim 1, wherein the annular resistor includes a first periphery and a second periphery, wherein the first periphery is electrically coupled to the second conductor, and the second periphery is electrically coupled to the second terminal of the capacitor.

3. The electrical power distribution structure as recited in claim 2, wherein the annular resistor is printed on the second conductor.

4. The electrical power distribution structure as recited in claim 1, wherein one of the first conductor and the second conductor is a ground plane and wherein the other conductor is a power plane.

5. The electrical power distribution structure as recited in claim 1, wherein at least one of the first conductor and the second conductor is planar.

6. The electrical power distribution structure as recited in claim 1, wherein the annular resistor is substantially circular in shape.

7. The electrical power distribution structure as recited in claim 2, wherein the first periphery of the annular resistor is an outer periphery, and the second periphery of the annular resistor is an inner periphery.

8. The electrical power distribution structure as recited in claim 1, wherein the required mounted resistance of the capacitor is determined by a formula $R_{m\text{-}req}=n\cdot Z_t$, wherein $R_{m\text{-}req}$ is the required mounted resistance of the capacitor, n is a quantity of capacitors in the electrical power distribution structure, and $Z_t$ is a target impedance of the electrical power distribution structure.

9. A method for achieving a target electrical impedance in an electrical power distribution structure, the method comprising:
    providing a first conductor and a second conductor;
    electrically coupling a first terminal of a capacitor to the first conductor;
    selecting an annular resistor such that a sum of a resistance value of the annular resistor and an equivalent series resistance (ESR) value of the capacitor is substantially equal to a required mounted resistance of the capacitor; and
    electrically coupling an annular resistor in series with a second terminal of the capacitor and the second conductor.

10. The method as recited in claim 9, wherein the first conductor is a ground plane and the second conductor is a power plane.

11. The method as recited in claim 9, wherein at least one of the first conductor and the second conductor is planar.

12. The method as recited in claim 9, wherein the annular resistor is substantially circular in shape.

13. The method as recited in claim 9, wherein the annular resistor is printed on the second conductor.

14. The method as recited in claim 9, wherein the required mounted resistance of the capacitor is determined by a formula $R_{m\text{-}req}=n\cdot Z_t$, wherein $R_{m\text{-}req}$ is the required mounted resistance of the capacitor, n is a quantity of capacitors in the electrical power distribution structure, and $Z_t$ is a target impedance of the electrical power distribution structure.

15. An electrical power distribution structure comprising:
    a first conductor and a second conductor;
    an annular resistor having a first periphery electrically coupled to the first conductor;
    an electrically conductive via coupled to a second periphery of the annular resistor; and a capacitor coupled in series with the annular resistor, the annular resistor being interposed between the via and the second conductor;

wherein a sum of a resistance value of the annular resistor and an equivalent series resistance (ESR) value of the capacitor is substantially equal to a required mounted resistance of the capacitor.

16. The electrical power distribution structure as recited in claim 15, wherein the annular resistor is formed in a region that is coplanar with the first conductor.

17. The electrical power distribution structure as recited in claim 15, wherein the annular resistor is formed within a void defined by the first conductor.

18. The electrical power distribution structure as recited in claim 15, wherein one of the first conductor and the second conductor is a power plane and the other conductor is a ground plane.

19. The electrical power distribution structure as recited in claim 15, wherein the capacitor has a first terminal and a second terminal, the first terminal being electrically coupled to the second periphery of the annular resistor and the second terminal being electrically coupled to second conductor.

20. The electrical power distribution structure as recited in claim 15, wherein at least one of the first conductor and the second conductor is planar.

21. The electrical power distribution structure as recited in claim 15, wherein the annular resistor is substantially circular in shape.

22. The electrical power distribution structure as recited in claim 15, wherein the first periphery of the annular resistor is an outer periphery and the second periphery of the annular resistor is an inner periphery.

23. The electrical power distribution structure as recited in claim 15, wherein the via is electrically coupled to the second periphery of the annular resistor.

24. The electrical power distribution structure as recited in claim 15, wherein the first periphery of the annular resistor is electrically coupled to the first conductor.

25. The electrical power distribution structure as recited in claim 15, wherein the required mounted resistance of the capacitor is determined by a formula $R_{m\text{-}req}=n\cdot Z_t$, wherein $R_{m\text{-}req}$ is the required mounted resistance of the capacitor, n is a quantity of capacitors in the electrical power distribution structure, and $Z_t$ is a target impedance of the electrical power distribution structure.

26. A method for decoupling a power distribution system comprising first and second conductors, the method comprising:

placing a first periphery of an annular resistor in contact with the first conductor;

placing an electrically conductive via in contact with a second periphery of the annular resistor, wherein a sum of a resistance value of the annular resistor and an equivalent series resistance (ESR) value of the capacitor is substantially equal to a required mounted resistance of the capacitor; and coupling a capacitor in series with the annular resistor, wherein the annular resistor is interposed between the via and the second conductor.

27. The method as recited in claim 26, wherein the annular resistor is formed within a void defined by the first conductor.

28. The method as recited in claim 26, wherein the first conductor is a power plane and the second conductor is a ground plane.

29. The method as recited in claim 26, wherein the capacitor has a first terminal and a second terminal, the first terminal being electrically coupled to the second periphery of the annular resistor and the second terminal being connected to the second conductor.

30. The method as recited in claim 26, wherein at least one of the first conductor and the second conductor is planar.

31. The method as recited in claim 26, wherein the annular resistor is substantially circular in shape.

32. The method as recited in claim 26, wherein the first periphery of the annular resistor is an outer periphery, and the second periphery of the annular resistor is an inner periphery.

33. The method as recited in claim 26, wherein the via is electrically coupled to the second periphery of the annular resistor.

34. The method as recited in claim 26, wherein the first periphery of the annular resistor is electrically coupled to the first conductor.

35. The method as recited in claim 26, wherein the annular resistor is formed in a region that is coplanar with the first conductor.

36. The method as recited in claim 26, wherein the required mounted resistance of the capacitor is determined by a formula $R_{m\text{-}req}=n\cdot Z_t$, wherein $R_{m\text{-}req}$ is the required mounted resistance of the capacitor, n is a quantity of capacitors in the electrical power distribution structure, and $Z_t$ is a target impedance of the electrical power distribution structure.

* * * * *